(12) United States Patent
Chung et al.

(10) Patent No.: US 7,414,362 B2
(45) Date of Patent: Aug. 19, 2008

(54) DISPLAY PANEL

(75) Inventors: Jin-Koo Chung, Suwon-si (KR);
Dong-Won Lee, Seongnam-si (KR);
Beohm-Rock Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 544 days.

(21) Appl. No.: 11/172,802

(22) Filed: Jul. 5, 2005

(65) Prior Publication Data
US 2006/0001366 A1    Jan. 5, 2006

(30) Foreign Application Priority Data
Jul. 2, 2004  (KR) ...................... 10-2004-0051426

(51) Int. Cl.
*H01J 1/62* (2006.01)
(52) U.S. Cl. ...................... 313/506; 313/504
(58) Field of Classification Search ................ 313/498, 313/504, 506, 512
See application file for complete search history.

(56) References Cited
U.S. PATENT DOCUMENTS
6,692,845 B2    2/2004  Maruyama
2003/0042848 A1 *  3/2003  Park et al. .................... 313/503

FOREIGN PATENT DOCUMENTS
| | | |
|---|---|---|
| CN | 1729726 | 2/2006 |
| JP | 09097676 | 4/1997 |
| JP | 2000173779 | 6/2000 |
| JP | 2001282136 | 10/2001 |
| JP | 2001291595 | 10/2001 |
| JP | 2003059657 | 2/2003 |
| JP | 2003109771 | 4/2003 |
| JP | 2003133078 | 5/2003 |
| JP | 2003142274 | 5/2003 |
| JP | 2003197367 | 7/2003 |
| JP | 2003217835 | 7/2003 |
| JP | 2003282273 | 10/2003 |
| JP | 2003303687 | 10/2003 |
| KR | 100356141 | 9/2002 |
| KR | 1020030010368 | 2/2003 |
| KR | 1020030070839 | 9/2003 |
| KR | 1020040000630 | 1/2004 |

* cited by examiner

*Primary Examiner*—Vip Patel
(74) *Attorney, Agent, or Firm*—Cantor Colburn LLP

(57) ABSTRACT

A display panel for an organic light emitting display including a plurality of anode electrodes and a cathode electrode that is supplied with a predetermined voltage and includes a first portion facing the anode electrodes and a second portion receiving the predetermined voltage and having a different cross section than the first portion. A plurality of light emitting members is arranged between the anode electrodes and the cathode electrode, and a conductive line transmits the predetermined voltage and contacts the second portion of the cathode electrode.

20 Claims, 27 Drawing Sheets

DISPLAY PANEL

CROSS-REFERENCE TO RELATED APPLICATION

This application claims priority to and the benefit of Korean Patent Application No. 10-2004-0051426, filed on Jul. 2, 2004, which is hereby incorporated by reference for all purposes as if fully set forth herein.

BACKGROUND OF THE INVENTION

1. Field of the Invention

The present invention relates to a display panel and in particular, to a panel for an organic light emitting diode display.

2. Discussion of the Background

Generally, an organic light emitting diode (OLED) display is a self emissive display device that displays images by exciting an emissive organic material to emit light. A light emitting element of an OLED display includes an anode (hole injection electrode), a cathode (electron injection electrode), and an organic light emission layer interposed therebetween. When holes and electrons are injected into the light emission layer, they recombine and emit light when transitioning from an excited state to a ground state. The organic light emission layer may further include one or more of an electron transport layer (ETL) and a hole transport layer (HTL) as well as an electron injecting layer (EIL) and a hole injecting layer (HIL) for enhancing the light emission.

The OLED display includes a plurality of pixels, and each pixel includes an anode, a cathode, and a light emission layer. The pixels may be arranged in a matrix, and they may be driven in passive matrix (or simple matrix) addressing or active matrix addressing.

The passive matrix OLED display includes a plurality of anode lines, a plurality of cathode lines intersecting the anode lines, and a plurality of pixels, each including a light emission layer. Selecting an anode line and a cathode line causes a pixel located at the intersection of the selected signal lines to emit light.

The active matrix (AM) OLED display includes a plurality of pixels, and each pixel may include a switching transistor, a driving transistor, and a storage capacitor as well as an anode, a cathode, and a light emission layer. The AM OLED display further includes a plurality of gate lines transmitting gate signals and a plurality of data lines transmitting data voltages. The switching transistor is coupled to a gate line and a data line, and it transmits the data voltage from the data line in response to the gate signal from the gate line. The driving transistor receives the data voltage from the switching transistor and drives a current having a magnitude corresponding to the data voltage. The current from the driving transistor enters the light emission layer to cause light emission having an intensity depending on the current. The storage capacitor is coupled between the data voltage and a supply voltage to maintain their voltage difference. The gray scaling of the AM OLED display is accomplished by controlling the data voltages to adjust the current driven by the driving transistor. The OLED display represents colors by providing red, green and blue light emission layers.

Additionally, OLED displays may be top emission and bottom emission displays depending on a light emitting direction. The top emission OLED display includes a transparent cathode, which is usually made of indium tin oxide (ITO) or indium zinc oxide (IZO), and an opaque anode. Conversely, the bottom emission OLED display includes an opaque cathode and a transparent anode. The relative positions of the anode and the cathode may be altered if required.

The cathode is supplied with a common voltage through another conductor, and the contact resistance between the cathode and the conductor may be high.

SUMMARY OF THE INVENTION

The present invention provides an OLED device that may have decreased contact resistance between a common electrode and a common voltage line.

Additional features of the invention will be set forth in the description which follows, and in part will be apparent from the description, or may be learned by practice of the invention.

The present invention discloses a display panel for an organic light emitting display including a plurality of anode electrodes, and a cathode electrode that is supplied with a predetermined voltage and includes a first portion facing the anode electrodes and a second portion receiving the predetermined voltage and having a different cross-section than the first portion. A plurality of light emitting members is arranged between the anode electrodes and the cathode electrode, and a conductive line transmits the predetermined voltage and contacts the second portion of the cathode electrode.

The present invention also discloses a display panel for an organic light emitting display including a plurality of anode electrodes, a plurality of light emitting members arranged on the anode electrodes, respectively, a metal layer including a first portion arranged on the light emitting members and a second portion spaced apart from the light emitting members, and a conductive line coupled to the second portion of the metal layer. The conductive line is arranged on a layer that is beneath a layer that the light emitting members are arranged on.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
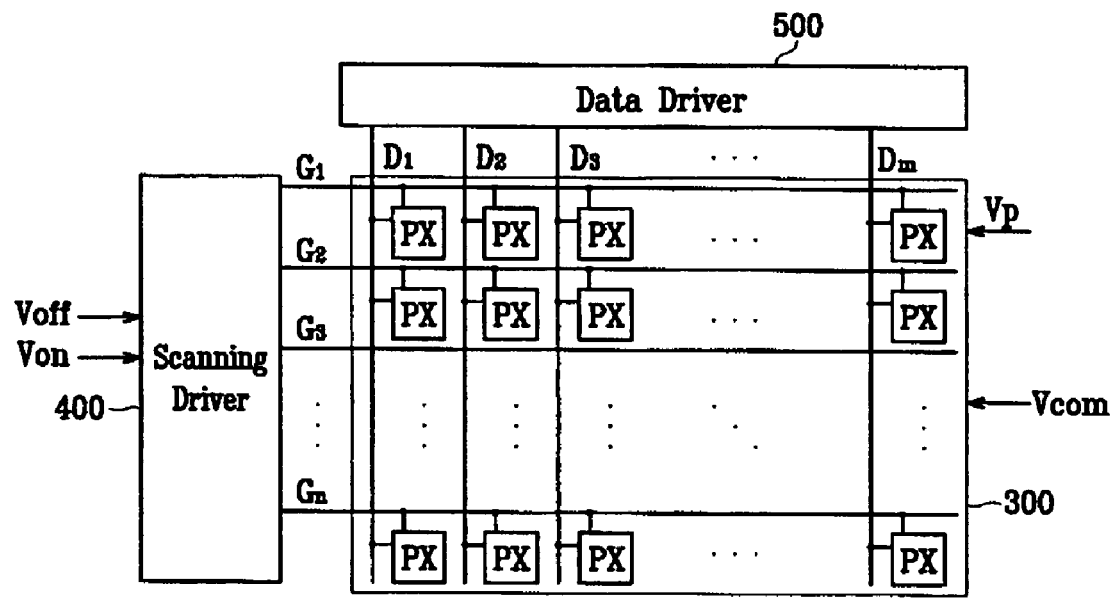
FIG. 1 is a block diagram of an OLED display according to an embodiment of the present invention.

The present invention now will be described more fully hereinafter with reference to the accompanying drawings, in which exemplary embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, display panels for an OLED display and manufacturing methods thereof according to embodiments of the present invention will be described with reference to accompanying drawings.

Figure 2:
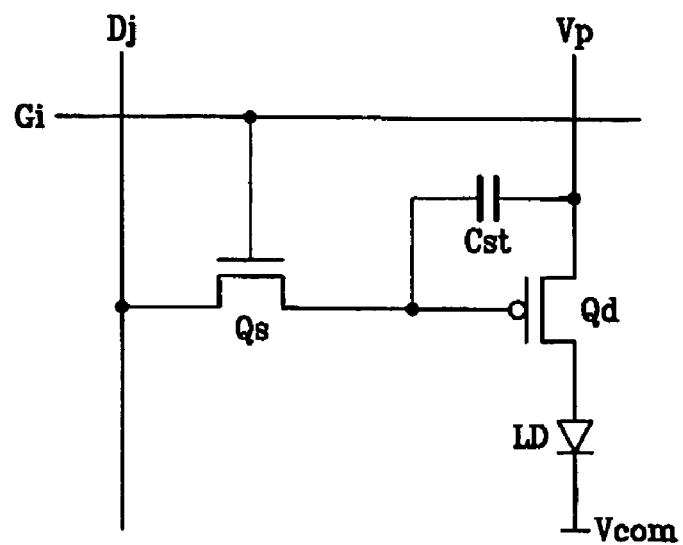
FIG. 2 is an equivalent circuit diagram of a pixel of an OLED display according to an embodiment of the present invention.

FIG. 1 is a block diagram of an OLED display according to an embodiment of the present invention, and FIG. 2 is an equivalent circuit diagram of a pixel of an OLED display according to an embodiment of the present invention.

Referring to FIG. 1, an OLED display according to an embodiment of the invention includes a display panel 300 and two drivers including a scanning driver 400 and a data driver 500, which are coupled to the display panel 300.

The display panel 300 includes a plurality of signal lines, and a plurality of pixels PX are coupled thereto and arranged substantially in a matrix.

The signal lines include a plurality of scanning lines $G_1$-$G_n$ for transmitting scanning signals and a plurality of data lines $D_1$-$D_m$ for transmitting data signals. The scanning lines $G_1$-$G_n$ extend substantially in a row direction and substantially parallel to each other, while the data lines $D_1$-$D_m$ extend substantially in a column direction and substantially parallel to each other.

Referring to FIG. 2, for example, each pixel PX may be coupled to a scanning line $G_i$ and a data line $D_j$ and may include an organic light emitting element LD, a driving transistor Qd, a capacitor Cst, and a switching transistor Qs.

The driving transistor Qd has a control terminal coupled to the switching transistor Qs, an input terminal coupled to a driving voltage Vp, and an output terminal coupled to the light emitting element LD.

The light emitting element LD has an anode coupled to the output terminal of the driving transistor Qd and a cathode coupled to a common voltage Vcom. The common voltage Vcom may be less than the driving voltage Vp and it may be a ground voltage, for example. The light emitting element LD emits light at an intensity depending on an output current of the driving transistor Qd, and the output current of the driving transistor Qd depends on the voltage between the control terminal and the input terminal of the driving transistor Qd.

The switching transistor Qs has a control terminal coupled to the scanning line $G_i$, an input terminal coupled to the data line $D_j$, and an output terminal coupled to the control terminal of the driving transistor Qd. The switching transistor Qs transmits the data signal from the data line $D_j$ to the driving transistor Qd in response to the scanning signal from the scanning line $G_i$.

As shown in FIG. 2, the switching transistor Qs is an N-channel field effect transistor (FET), while the driving transistor Qd is a P-channel FET. However, their types may be exchanged or both may be N channel FETs or P channel FETs. In this case, the connections between the transistors Qs and Qd and the light emitting element LD may be modified.

The transistors Qs and Qd may include polycrystalline silicon (polysilicon) or amorphous silicon (a-Si).

The capacitor Cst is coupled between the control terminal and the input terminal of the driving transistor Qd. The capacitor Cst charges and maintains a voltage corresponding to the data signal applied to the control terminal of the driving transistor Qd.

Referring to FIG. 1 again, the scanning driver 400 is coupled to the scanning lines $G_1$-$G_n$ of the display panel 300 and synthesizes a gate-on voltage Von for turning on the switching transistors Qs and a gate-off voltage Voff for turning off the switching transistors Qs to generate scanning signals to apply to the scanning lines $G_1$-$G_n$.

The data driver 500 is coupled to the data lines $D_1$-$D_m$ of the display panel 300 and applies data signals to the data lines $D_1$-$D_m$.

The scanning driver 400 and the data driver 500 may be implemented as an integrated circuit (IC) chip mounted on the display panel 300 or on a flexible printed circuit (FPC) film in a tape carrier package (TCP), which are attached to the display panel 300. Alternatively, they may be integrated into the display panel 300.

Now, a structure of a display panel for an OLED display according to an embodiment of the present invention will be described in detail with reference to FIGS. 3-8, as well as FIG. 1 and FIG. 2.

Figure 3:
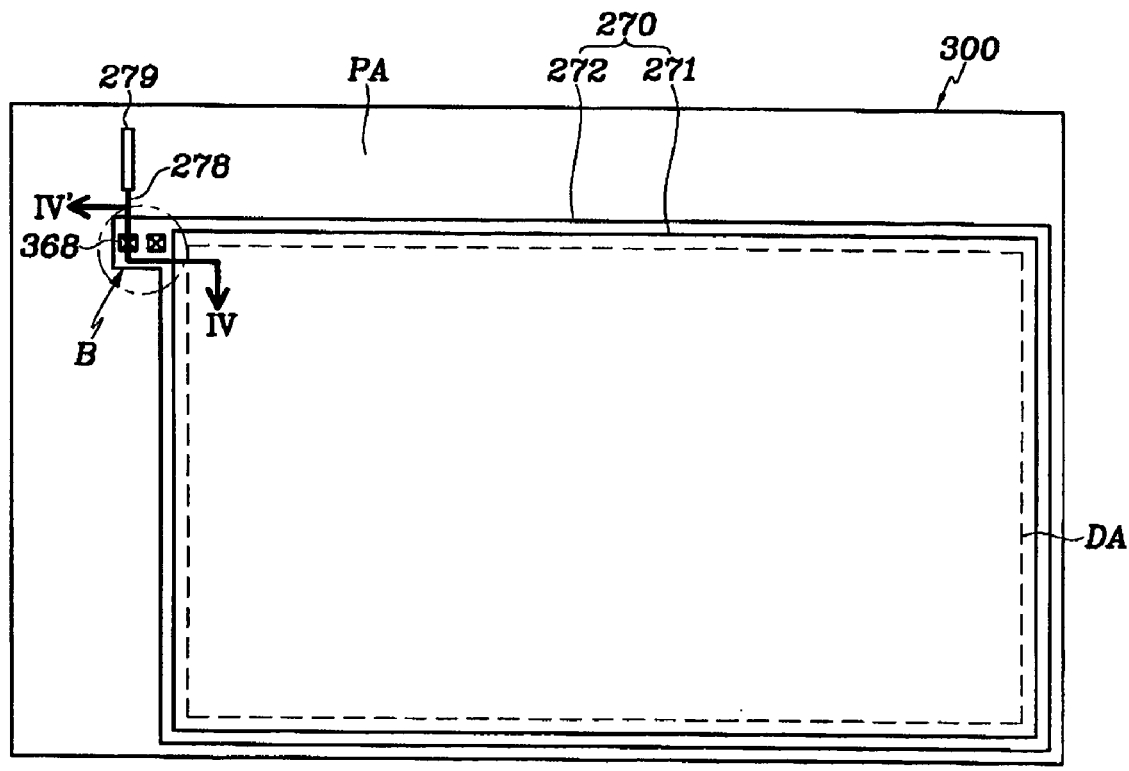
FIG. 3 is a schematic plan view of a display panel for an OLED display according to an embodiment of the present invention.
Figure 4:
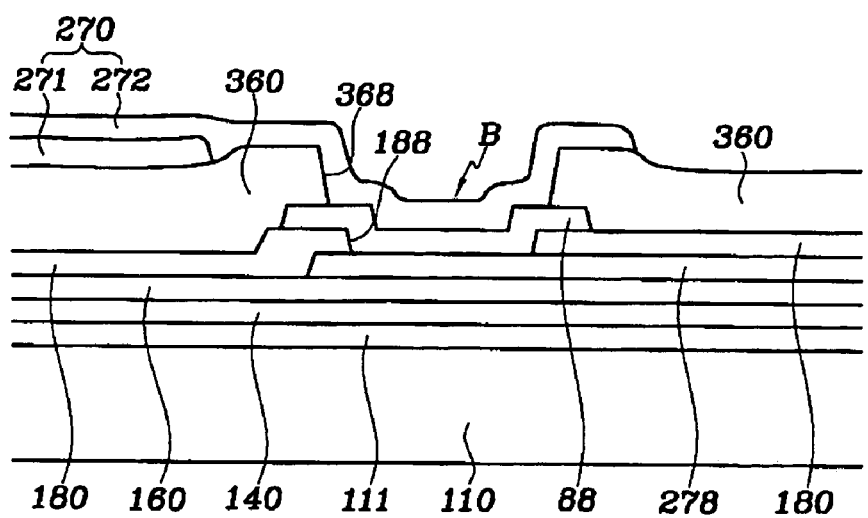
FIG. 4 is a section view of the display panel taken along line IV-IV' of FIG. 3.
Figure 5:
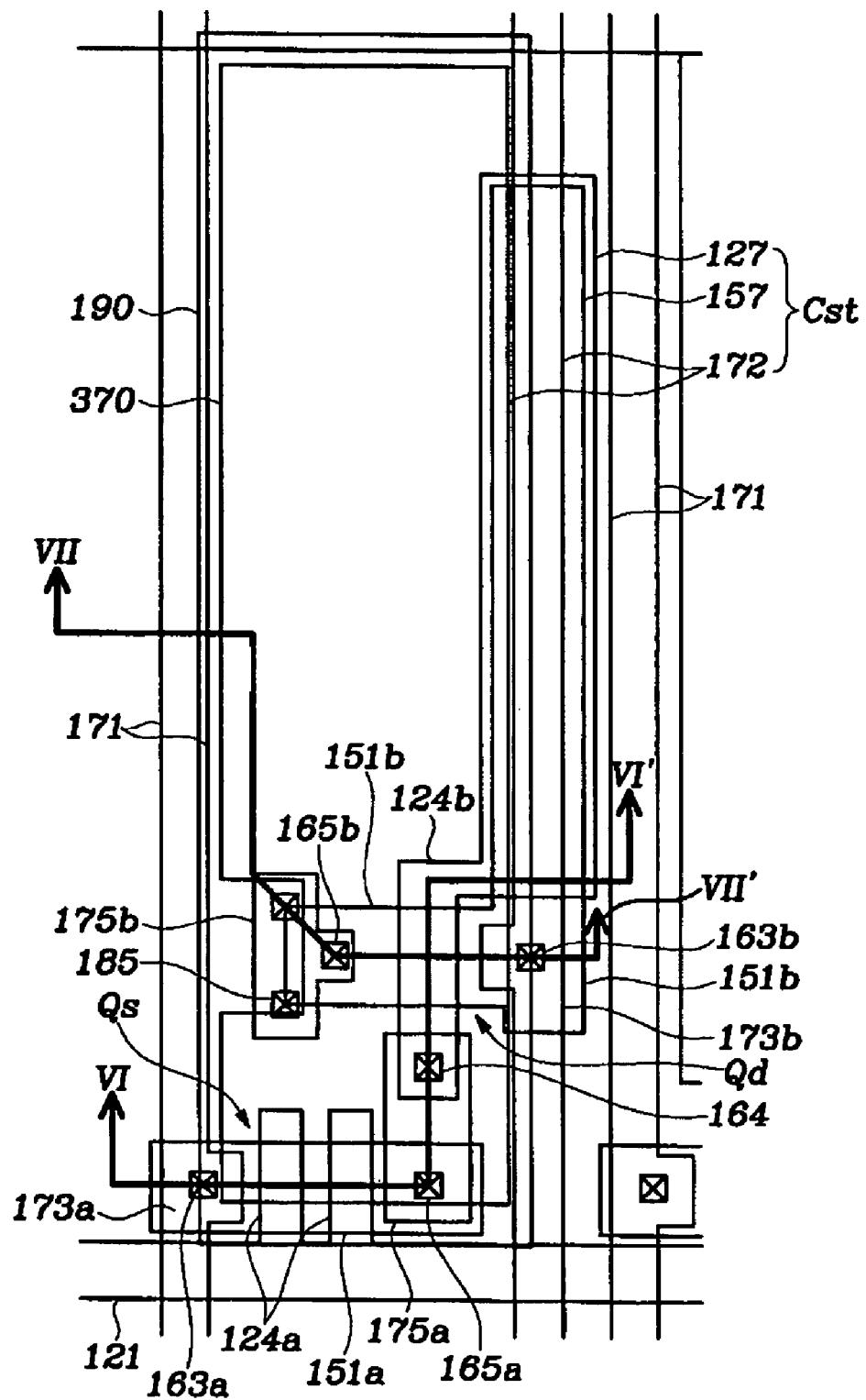
FIG. 5 is a layout view of a pixel and signal lines on the display panel of FIG. 3.
Figure 6:
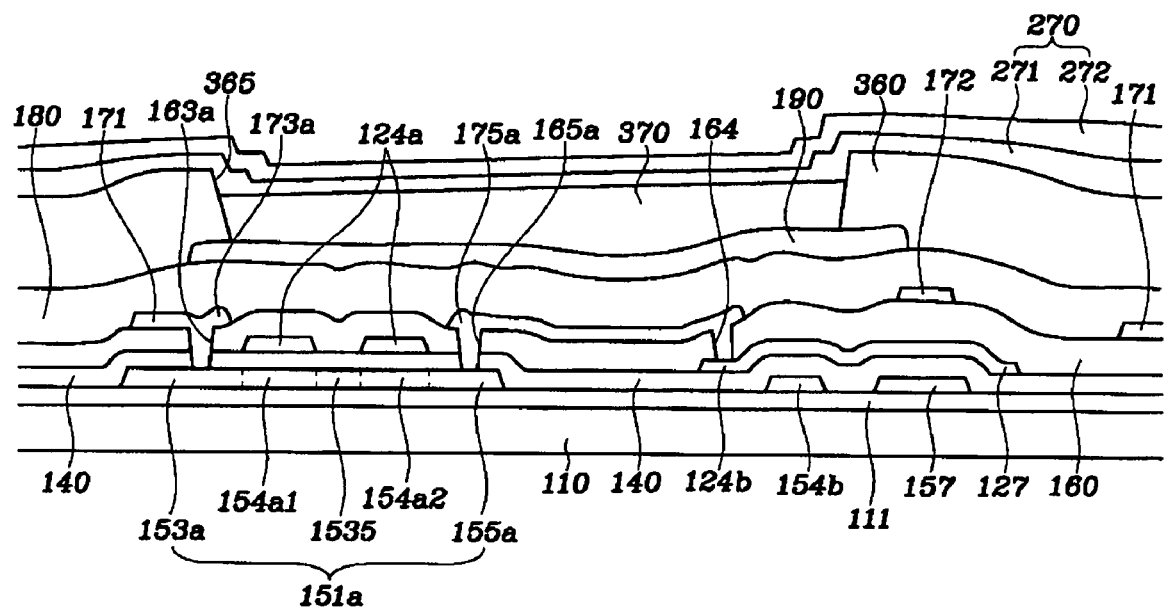
FIG. 6 and FIG. 7 are sectional views of the pixel and the signal lines taken along lines VI-VI' and VII-VII' of FIG. 5, respectively.
Figure 7:
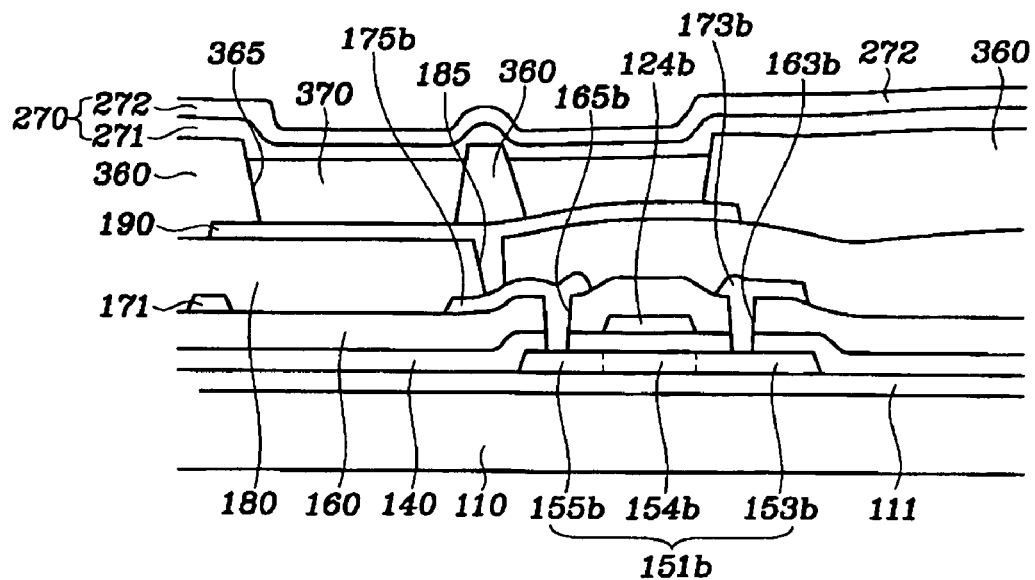
Figure 8:
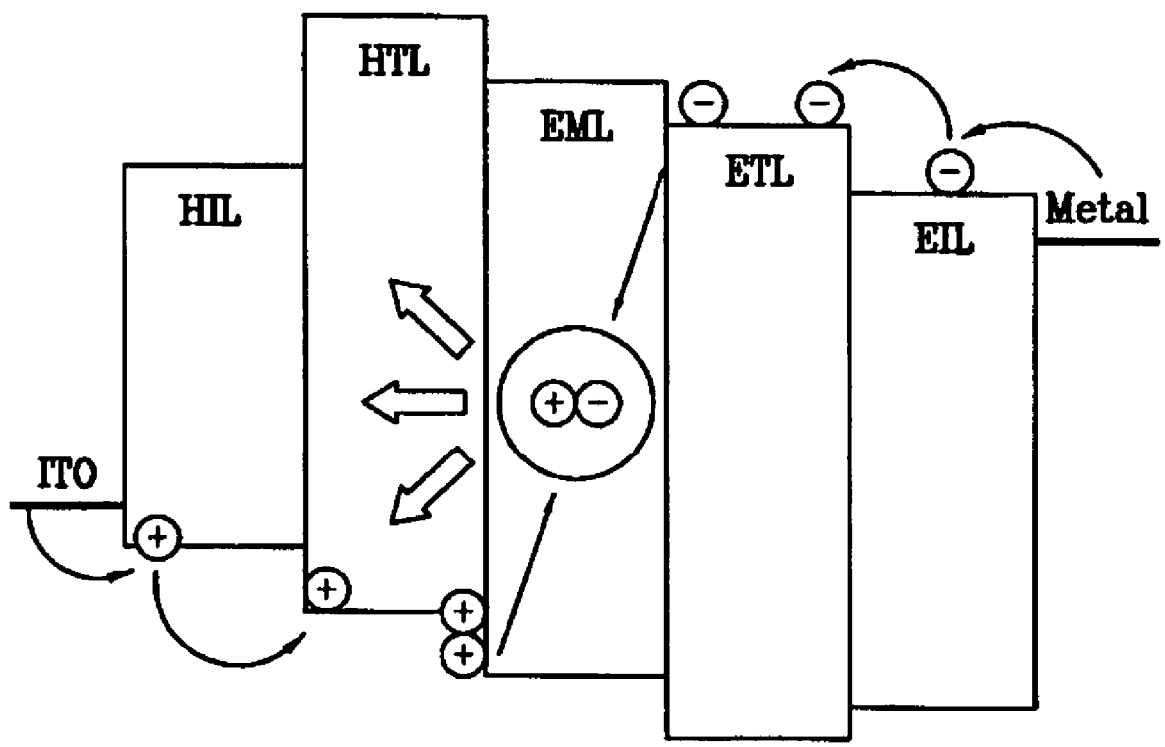
FIG. 8 is a schematic diagram of an organic light emitting element according to an embodiment of the present invention.

FIG. 3 is a schematic plan view of a display panel for an OLED display according to an embodiment of the present invention, FIG. 4 is a section view of the display panel taken along line IV-IV' of FIG. 3, FIG. 5 is a layout view of a pixel and signal lines on the display panel shown in FIG. 3, FIG. 6 and FIG. 7 are sectional views of the pixel and the signal lines taken along the lines VI-VI' and VII-VII' of FIG. 5, respectively, and FIG. 8 is a schematic diagram of an organic light emitting element according to an embodiment of the present invention.

Referring to FIG. 3, a display panel 300 according to an embodiment of the present invention includes a display area DA (enclosed by a dotted rectangle) and a peripheral area PA arranged outside the display area DA. The display area DA comprises a plurality of pixels PX.

A common electrode 270, which serves as cathodes of organic light emitting elements LD, is also provided on the display panel 300. The common electrode 270 covers the display area DA and includes a contact portion B arranged in the peripheral area PA for receiving a common voltage Vcom. The contact portion B of the common electrode 270 is coupled to a common voltage line 278, which includes a common voltage pad 279 for receiving the common voltage Vcom from an external device.

A plurality of signal lines including scanning lines $G_1$-$G_n$ and data lines $D_1$-$D_n$ are also provided on the display panel 300. The signal lines include portions arranged in the display area DA as well as end portions arranged in the peripheral area to receive signals including scanning signals and data signals.

The scanning driver 400 and the data driver 500 may be arranged outside the display panel 300, arranged on the peripheral area PA, or integrated into the peripheral area PA of the display panel 300 along with the pixels and the signal lines.

Next, referring to FIG. 3, FIG. 4, FIG. 5, FIG. 6 and FIG. 7, a detailed layered structure of the display panel will be described.

A blocking layer 111, which may be made of silicon oxide or silicon nitride, is formed on an insulating substrate 110, which may be made of transparent glass. The blocking layer 111 may have a dual-layered structure.

A plurality of semiconductor islands 151a and 151b, which may be made of polysilicon or a-Si, are formed on the blocking film 111. Each semiconductor island 151a and 151b may include a plurality of extrinsic regions containing an N-type or P-type conductive impurity and at least one intrinsic region hardly containing conductive impurity.

Regarding the semiconductor island 151a for the switching thin film transistor (TFT) Qs, the extrinsic regions include a first source region 153a, an intermediate region 153S, and a first drain region 155a, which are doped with an N-type impurity and separated from one another, and the intrinsic regions include a pair of (first) channel regions 154a1 and 154a2 disposed between the extrinsic regions 153a, 153S and 155a.

Concerning the semiconductor island 151b for the driving TFT Qd, the extrinsic regions include a second source region 153b and a second drain region 155b, which are doped with a P-type impurity and separated from one another, and the intrinsic region includes a channel region 154b arranged between the second source region 153b and the second drain region 155b. The second source region 153b extends to form a storage electrode region 157.

The extrinsic regions may further include lightly doped regions (not shown) disposed between the channel regions 154a1, 154a2 and 154b and the source and the drain regions 153a, 155a, 153b and 155b. The lightly doped regions may be substituted with offset regions that contain substantially no impurity.

Alternatively, the extrinsic regions 153a and 155a of the first semiconductor islands 151a may be doped with P-type impurity, while the extrinsic regions 153b and 155b of the second semiconductor islands 151b may be doped with N-type impurity, depending on driving conditions. The conductive impurity may include a P-type impurity such as boron (B) and gallium (Ga) and an N-type impurity such as phosphorous (P) and arsenic (As).

The semiconductor islands 151a and 151b may be made of a-Si. In this case, there are no impurity regions, and ohmic contacts may be formed on the semiconductor islands 151a and 151b to improve contact characteristics between semiconductor islands 151a and 151b and other metal layers.

A gate insulating layer 140, which may be made of silicon oxide or silicon nitride, is formed on the semiconductor islands 151a and 151b and the blocking film 111.

A plurality of gate conductors including a plurality of gate lines 121, including a plurality of pairs of first gate electrodes 124a, and a plurality of second gate electrodes 124b are formed on the gate insulating layer 140.

The gate lines 121, which transmit gate signals, extend substantially in a transverse direction. Each pair of first gate electrodes 124a protrudes upward from the gate line 121, and they cross the first semiconductor islands 151a such that they overlap the pair of the first channel regions 154a1 and 154a2. Each gate line 121 may include an expanded end portion having a large area for coupling with another layer or an external driving circuit. The gate lines 121 may be directly connected to a gate driving circuit for generating the gate signals, which may be integrated on the substrate 110.

The second gate electrodes 124b are separate from the gate lines 121 and they cross the second semiconductor islands 151b such that they overlap the second channel regions 154b. The second gate electrodes 124b extend to form storage electrodes 127 that overlap the storage electrode regions 157 of the second semiconductor islands 151b, thereby forming storage capacitors Cst.

The gate conductors 121 and 124b may be made of low resistivity material including, for example, Al containing metal such as Al and Al alloy (e.g. Al—Nd), Ag containing metal such as Ag and Ag alloy, and Cu containing metal such as Cu and Cu alloy. The gate conductors 121 and 124b may have a multi-layered structure including two films having different physical characteristics. In this case, one of the two films may be made of low resistivity metal including Al containing metal, Ag containing metal, and Cu containing metal for reducing signal delay or voltage drop in the gate conductors 121 and 124b. The other film may be made of material such as Cr, Mo and Mo alloy, Ta or Ti, which has good physical, chemical, and electrical contact characteristics with other materials such as indium tin oxide (ITO) or indium zinc oxide (IZO). Examples of the layered structure include a lower Cr film and an upper Al—Nd alloy film and a lower Al film and an upper Mo film.

Additionally, the lateral sides of the gate conductors 121 and 124b may be inclined relative to a surface of the substrate 110 at an angle of about 30-80 degrees.

An interlayer insulating layer 160 is formed on the gate conductors 121 and 124b. The interlayer insulating layer 160 may be made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The interlayer insulating layer 160 has a plurality of contact holes 164 exposing the second gate electrodes 124b. Additionally, the interlayer insulating layer 160 and the gate insulating layer 140 have a plurality of contact holes 163a, 163b, 165a and 165b exposing the source regions 153a and 153b and the drain regions 155a and 155b, respectively.

A plurality of data conductors including a plurality of data lines 171, a plurality of driving voltage lines 172, a plurality of first and second drain electrodes 175a and 175b, and a common voltage line 278 are formed on the interlayer insulating film 160.

The data lines 171, which transmit data signals, extend substantially in the longitudinal direction and cross the gate lines 121. Each data line 171 includes a plurality of first source electrodes 173a, which are coupled to the first source regions 153a through the contact holes 163a. Each data line 171 may include an expanded end portion having a large area for coupling with another layer or an external driving circuit. The data lines 171 may be directly connected to a data driving circuit for generating the data signals, which may be integrated on the substrate 110.

The driving voltage lines 172, which transmit driving voltages for the driving TFT Qd, extend substantially in the longitudinal direction and cross the gate lines 121. Each driving voltage line 172 includes a plurality of second source electrodes 173b, which are coupled to the second source regions 153b through the contact holes 163b. The driving voltage lines 172 may be coupled to each other.

The first drain electrodes 175a are separated from the data lines 171 and the driving voltage lines 172 and are coupled to the first drain regions 155a through the contact holes 165a and to the second gate electrodes 124b through the contact holes 164.

The second drain electrodes 175b are separated from the data lines 171 and the driving voltage lines 172 and are coupled to the second drain regions 155b through the contact holes 165b.

The common voltage line 278 includes a common voltage pad 279 arranged near an upper edge of the substrate 110 as shown in FIG. 3. The common voltage line 278 may be formed of the same layer as the gate lines 121.

The data conductors 171, 172, 175a, 175b and 278 may be made of refractory metal including Cr, Mo, Ti, Ta or alloys thereof. They may have a multi-layered structure including a low resistivity film and a good contact film. An example of the multi-layered structure includes a double-layered structure of a lower Cr film and an upper Al (alloy) film, a double-layered structure of a lower Mo (alloy) film and an upper Al (alloy) film, and a triple-layered structure of a lower Mo film, an intermediate Al film, and an upper Mo film.

Like the gate conductors 121 and 124b, the data conductors 171, 172, 175a, 175b and 278 have inclined edge profiles at an angle of about 30-80 degrees to the substrate.

A passivation layer 180 is formed on the data conductors 171, 172, 175a, 175b and 278. The passivation layer 180 may be made of photosensitive organic material having a good flatness characteristic, low dielectric insulating material such as a-Si:C:O and a-Si:O:F formed by PECVD, or inorganic material such as silicon nitride and silicon oxide.

The passivation layer 180 has a plurality of contact holes 185 and 188 exposing the second drain electrodes 175b and the common voltage line 278, respectively. The passivation layer 180 may further include a plurality of contact holes (not shown) exposing end portions of the data lines 171, and the passivation layer 180 and the interlayer insulating layer 160 may have a plurality of contact holes (not shown) exposing end portions of the gate lines 121. When the common voltage line 278 is arranged under the interlayer insulating layer 160, the contact holes 188 may penetrate the interlayer insulating layer 160.

A plurality of pixel electrodes 190 and a contact assistant 88 may be formed on the passivation layer 180.

The pixel electrodes 190 may serve as anodes of light emitting elements LD shown in FIG. 2, and they may be coupled to the second drain electrodes 175b through the contact holes 185. The pixel electrodes 190 and the contact assistant 88 may be made of a transparent conductor such as ITO or IZO. However, the pixel electrode 190 may be made of an opaque reflective conductor such as Al, Ag, Ca, Ba and Mg.

The contact assistant 88 is coupled to the common voltage line 278 through the contact holes 188 to cover the exposed portion of the common voltage line 278. The contact assistant 88 may be omitted, or more than one contact assistant may be formed.

A plurality of contact assistants or connecting members (not shown) may be also formed on the passivation layer 180 such that they are connected to the exposed end portions of the gate lines 121, the data lines 171, or the common voltage pad 279.

A partition 360, which separates pixels of the OLED display, is formed on the passivation layer 180 and the pixel electrodes 190. The partition 360 surrounds the pixel electrodes 190 to define openings 365 to be filled with organic light emitting material. The partition 360 has a plurality of contact holes 368 exposing the contact assistants 88, and it may be made of organic or inorganic insulating material.

A plurality of light emitting members 370 are formed on the pixel electrodes 190 and disposed in the openings 365 defined by the partition 360. The light emitting members 370 may be made of organic material emitting primary-color lights such as red, green and blue lights. The red, green and blue light emitting members 370 are periodically arranged.

A common electrode 270 including a lower electrode 271 and an upper electrode 272 is formed on the light emitting members 370 and the partition 360. The common electrode 270 is supplied with the common voltage Vcom.

The lower electrode 271 may be made of an insulator such as LiF or an alkali, or an alkali earth metal such as Ba, Ca, or Li, while the upper electrode 272 may be made of low resistivity metal such as Al, Ag, or their alloys. The lower electrode 271, which may contact the light emitting members 370, may have a low work function such that the lower electrode 271 facilitates the injection of electrons into the light emitting members 370. The upper electrode 272 may be made of low resistivity material resistant to oxidation such that the upper electrode 272 protects the lower electrode 271 and reduces the distortion of the common voltage Vcom.

As FIG. 3 and FIG. 4 show, the upper electrode 272 includes a contact portion B contacting the contact assistant 88 through the contact holes 368, and the lower electrode 271 does not contact the contact assistant 88. This structure reduces the contact resistance between the common electrode 270 and the contact assistant 88 or the common voltage line 278. In detail, metal having a low work function such as Ba or Ca may be easily melted by a small amount of heat such as that generated at the contact portion B, thereby increasing the contact resistance. Additionally, an insulator such as LiF also increases the contact resistance. With the above-described structure, the upper electrode 272 contacts the contact assistant 88, but the lower electrode 271 does not. Accordingly, the contact resistance between the common electrode 270 and the common voltage line 278 may be decreased.

In the above-described OLED display, a switching TFT Qs comprises a first semiconductor island 151*a*, a first gate electrode 124*a* connected to the gate line 121, a first source electrode 173*a* connected to the data line 171, and a first drain electrode 175*a*. Additionally, a driving TFT comprises a second semiconductor island 151*b*, a second gate electrode 124*b* connected to the first drain electrode 175*a*, a second source electrode 173*b* connected to the driving voltage line 172, and a second drain electrode 175*b* connected to a pixel electrode 190. Furthermore, a storage electrode region 157 coupled to a second source region 153*b* and a storage electrode 127 coupled to a second gate electrode 124*b* form a storage capacitor Cst. The exemplary TFTs Qs and Qd shown in FIGS. 5-7 are referred to as "top gate TFTs" since the gate electrodes 124*a* and 124*b* are arranged on the semiconductors 151*a* and 151*b*.

The organic light emitting member 370 may have a multi-layered structure as shown in FIG. 8. The organic light emitting member 370 includes at least an emitting layer EML, and it may further include auxiliary layers to improve the light emission efficiency of the emitting layer EML. The auxiliary layers may include an electron transport layer ETL and a hole transport layer HTL for improving the balance of electrons and holes, and an electron injecting layer EIL and a hole injecting layer HIL for improving the injection of electrons and holes. The lower electrode 271 of the common electrode 270 may serve as the electron injection layer EIL.

Now, a method of manufacturing the display panel shown in FIGS. 3-8 is described below with reference to FIGS. 9-27C as well as FIGS. 3-8.

FIG. 9, FIG. 11, FIG. 13, FIG. 15, FIG. 17, FIG. 19, FIG. 21, FIG. 23 and FIG. 25 are layout views of the display panel of FIGS. 3-8 in intermediate steps of a manufacturing method thereof according to an embodiment of the present invention. FIG. 10A and FIG. 10B are sectional views of the display panel taken along lines XA-XA' and XB-XB' of FIG. 9, respectively, and FIG. 10C is a sectional view of the display panel taken along line IV-IV' of FIG. 3 at this step. FIG. 12A and FIG. 12B are sectional views of the display panel taken along lines XIIA-XIIA' and XIIB-XIIB' of FIG. 11, respectively, and FIG. 12C is a sectional view of the display panel taken along line IV-IV' of FIG. 3 at this step. FIG. 14A and FIG. 14B are sectional views of the display panel taken along lines XIVA-XIVA' and XIVB-XIVB' of FIG. 13, respectively, and FIG. 14C is a sectional view of the display panel taken along line IV-IV' of FIG. 3 at this step. FIG. 16A and FIG. 16B are sectional views of the display panel taken along lines XVIA-XVIA' and XVIB-XVIB' of FIG. 15, respectively, and FIG. 16C is a sectional view of the display panel taken along line IV-IV' of FIG. 3 at this step. FIG. 18A and FIG. 18B are sectional views of the display panel taken along lines XVIIIA-XVIIIA' and XVIIIB-XVIIIB' of FIG. 17, respectively, and FIG. 18C is a sectional view of the display panel taken along line IV-IV' of FIG. 3 at this step. FIG. 20A and FIG. 20B are sectional views of the display panel taken along the lines XXA-XXA' and XXB-XXB' of FIG. 19, respectively, and FIG. 20C is a sectional view of the display panel taken along line IV-IV' of FIG. 3 at this step. FIG. 22A and FIG. 22B are sectional views of the display panel taken along lines XXIIA-XXIIA' and XXIIB-XXIIB' of FIG. 21, respectively, and FIG. 22C is a sectional view of the display panel taken along line IV-IV' of FIG. 3 at this step. FIG. 24A and FIG. 24B are sectional views of the display panel taken along lines XXIVA-XXIVA' and XXIVB-XXIVB' of FIG. 23, respectively, and FIG. 24C is a sectional view of the display panel taken along line IV-IV' of FIG. 3 at this step. FIG. 26A and FIG. 26B are sectional views of the display panel taken along lines XXVIA-XXVIA' and XXVIB-XXVIB' of FIG. 25, respectively, and FIG. 26C is a sectional view of the display panel taken along line IV-IV' of FIG. 3 at this step. FIG. 27A and FIG. 27B are sectional views of the display panel taken along lines XXVIA-XXVIA' and XXVIB-XXVIB' of FIG. 25, respectively, and illustrate a step following the step shown in FIG. 26A and FIG. 26B, and FIG. 27C is a sectional view of the display panel taken along line IV-IV' of FIG. 3 at this step.

Figure 9:
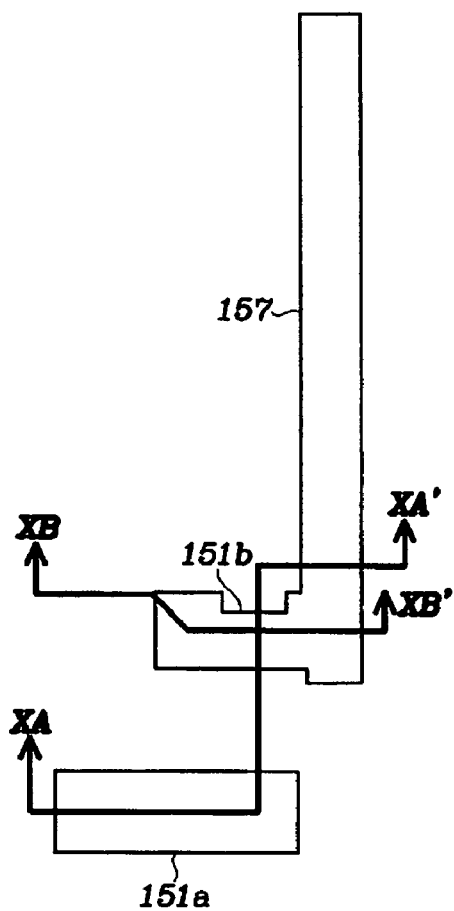
FIGS. 9, 11, 13, 15, 17, 19, 21, 23 and 25 are layout views of the display panel shown in FIGS. 3, 4, 5, 6, and 7 in intermediate steps of a manufacturing method thereof according to an embodiment of the present invention.
Figure 10A:
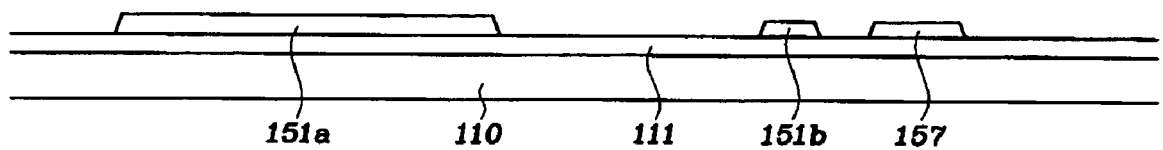
FIG. 10A and FIG. 10B are sectional views of the display panel taken along lines XA-XA' and XB-XB' of FIG. 9, respectively.
Figure 10B:
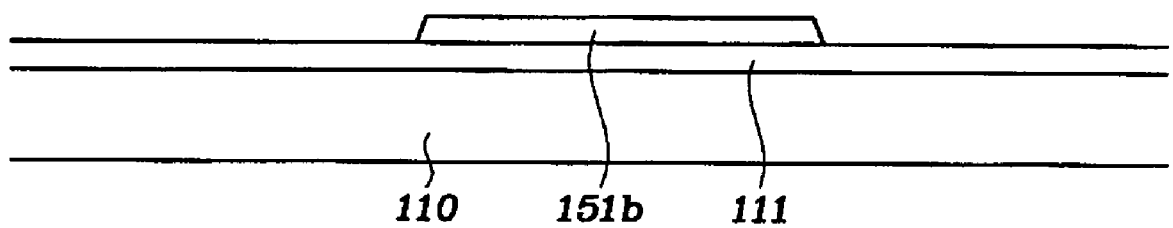
Figure 10C:
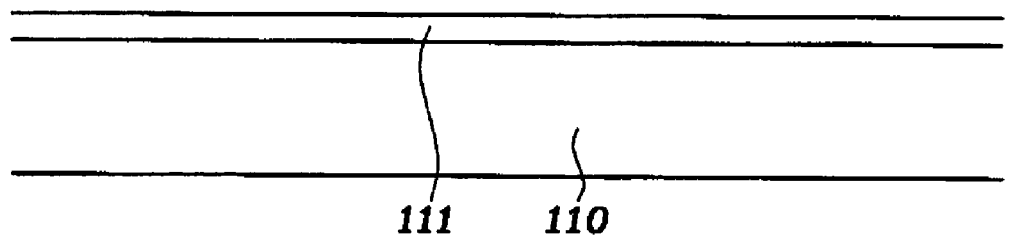
FIG. 10C is a sectional view of the display panel taken along line IV-IV' of FIG. 3 at this step.

Referring to FIGS. 9-10C, a blocking layer 111 is formed on an insulating substrate 110, and a semiconductor layer made of a-Si may be deposited on the blocking layer 111 by LPCVD (low pressure chemical vapor deposition), PECVD (plasma enhanced chemical vapor deposition) or sputtering.

Next, the semiconductor layer may be crystallized into polysilicon and photo-etched to form a plurality of pairs of first and second semiconductor islands 151*a* and 151*b*. Alternatively, the semiconductor layer may be left as an a-Si layer.

Figure 11:
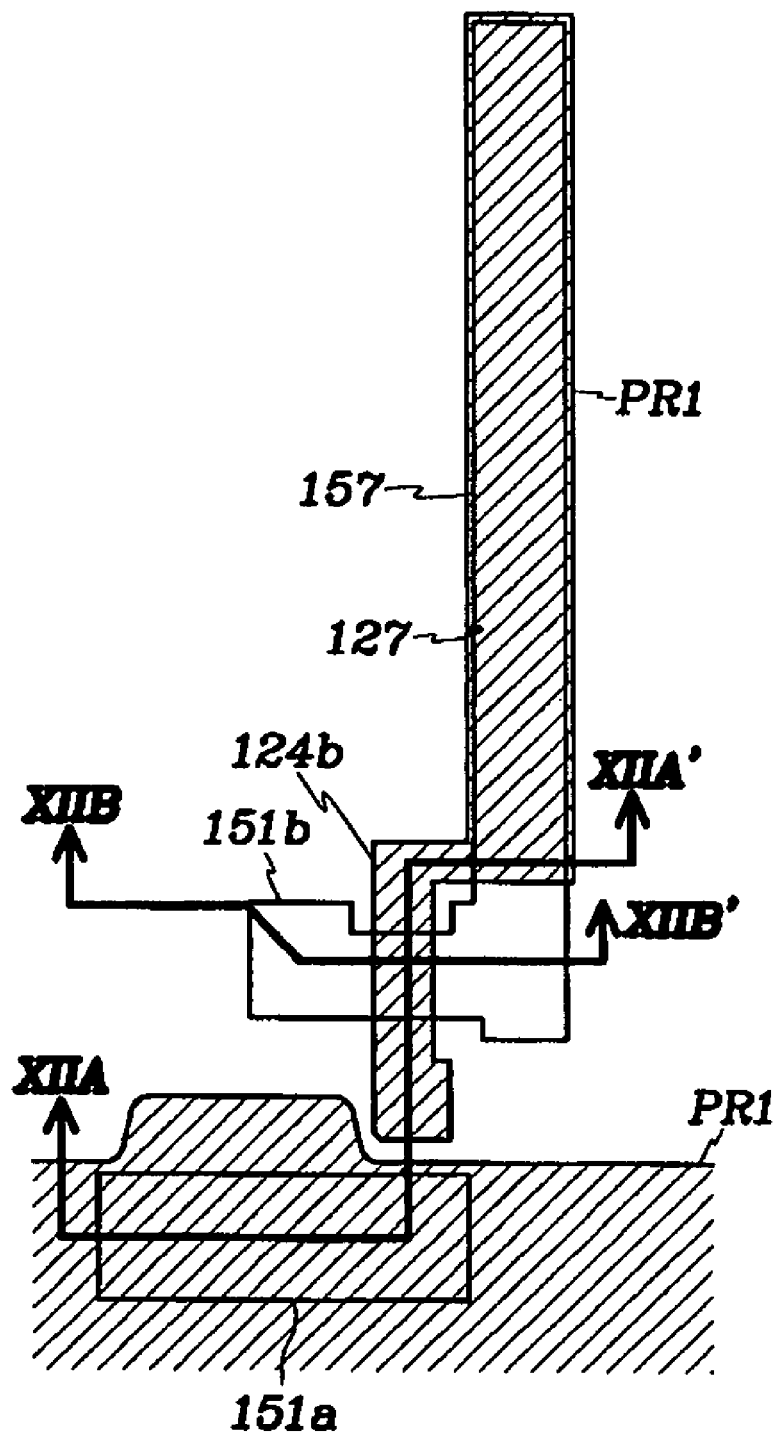
Figure 12A:
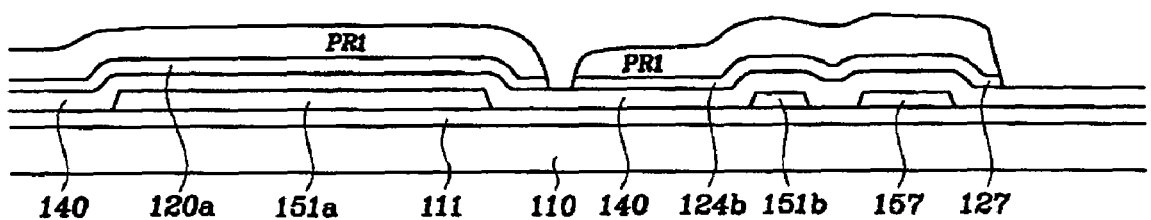
FIG. 12A and FIG. 12B are sectional views of the display panel taken along lines XIIA-XIIA' and XIIB-XIIB' of FIG. 11, respectively.
Figure 12B:
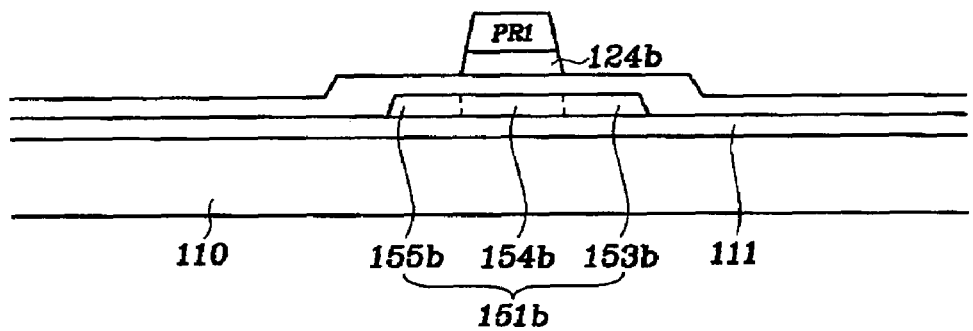
Figure 12C:
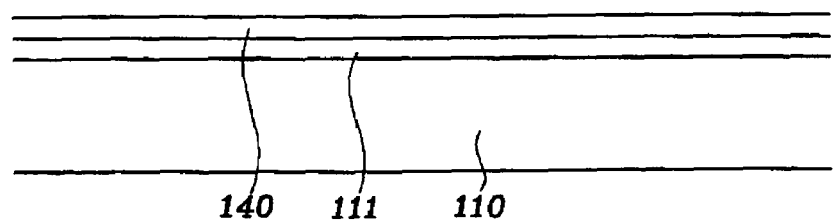
FIG. 12C is a sectional view of the display panel taken along line IV-IV' of FIG. 3 at this step.

Referring to FIGS. 11-12C, a gate insulating layer 140 and a gate metal layer are sequentially deposited on the substrate including the first and second semiconductor islands 151*a* and 151*b*, and a first photoresist PR1 is formed thereon. The gate metal layer is etched by using the first photoresist PR1 as an etch mask to form a plurality of gate electrodes 124*b*, including storage electrodes 127, and a plurality of gate metal members 120*a*. A P-type impurity is introduced into portions of the second semiconductor islands 151*b*, which are not covered with the gate electrodes 124*b* and the gate metal members 120*a* as well as the first photoresist PR1, to form a plurality of P-type extrinsic regions 153*b* and 155*b*. At this time, the first semiconductor islands 151*a* are covered with the first photoresist PR1 and the gate metal members 120*a* and protected from impurity implantation.

Figure 13:
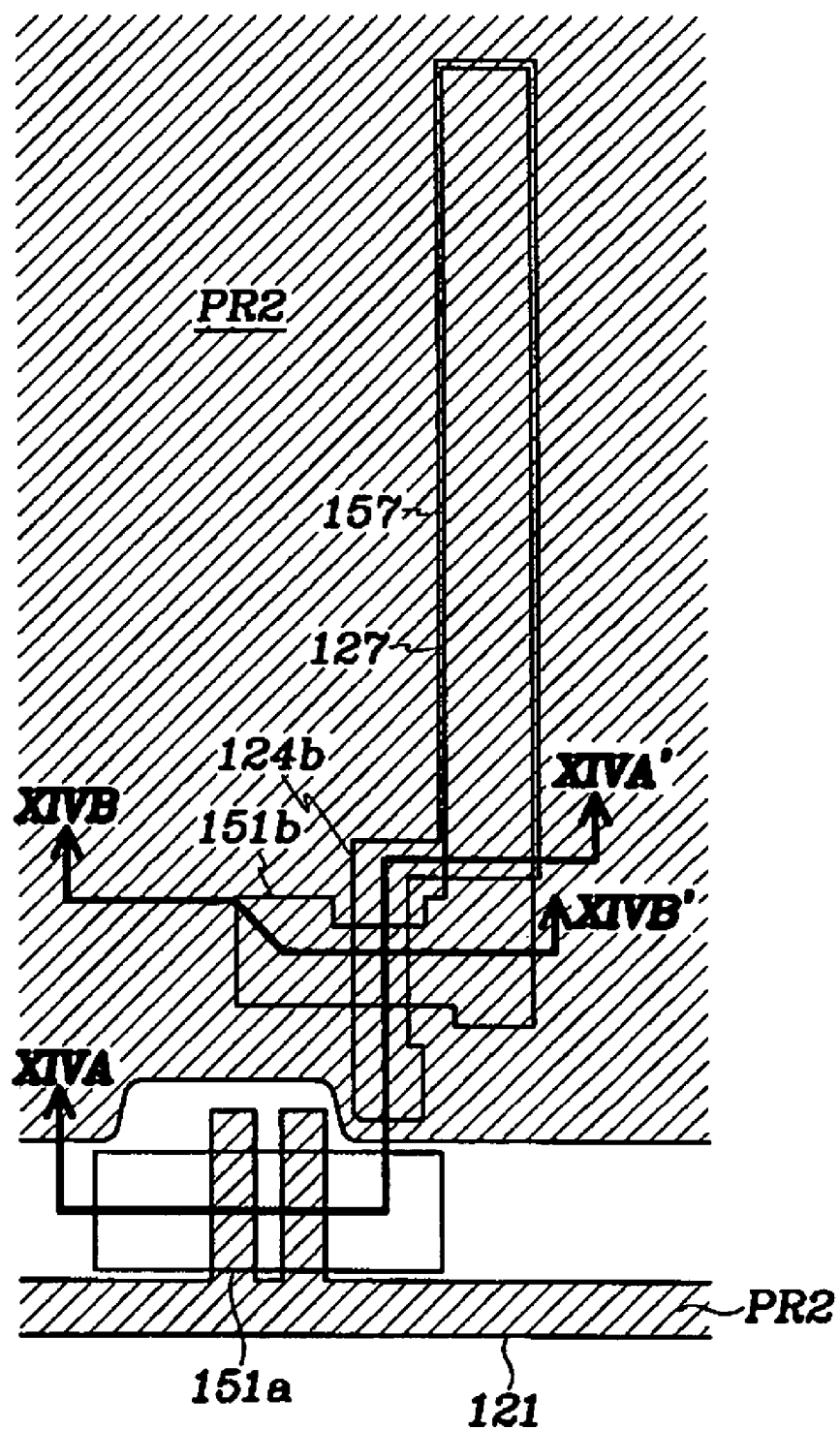
Figure 14A:
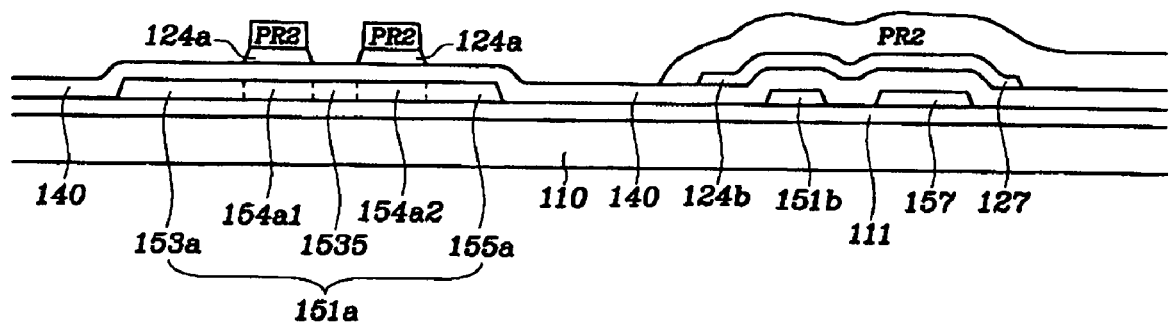
FIG. 14A and FIG. 14B are sectional views of the display panel taken along lines XIVA-XIVA' and XIVB-XIVB' of FIG. 13, respectively.
Figure 14B:
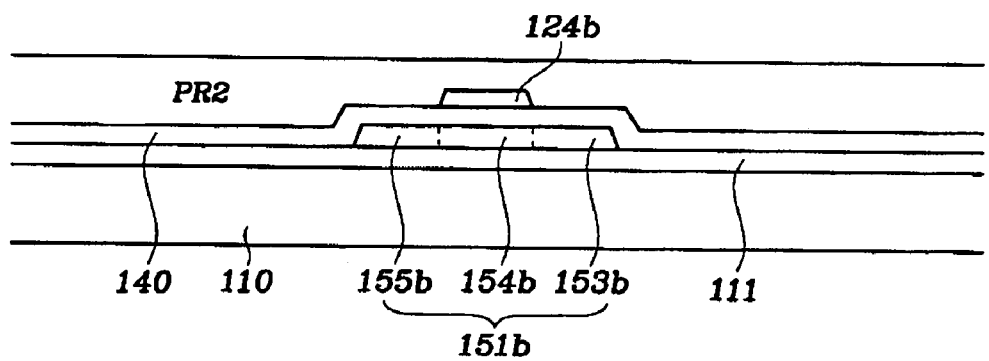
Figure 14C:
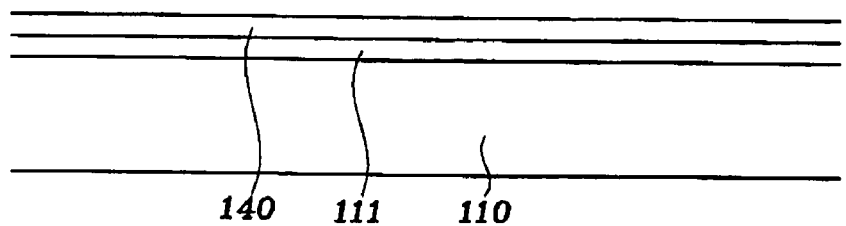
FIG. 14C is a sectional view of the display panel taken along line IV-IV' of FIG. 3 at this step.

Referring to FIGS. 13-14C, the first photoresist PR1 is removed, and a second photoresist PR2 is formed. The gate metal members 120*a* are etched using the second photoresist PR2 as an etch mask to form a plurality of gate lines 121 including gate electrodes 124*a*. An N-type impurity is injected into portions of the first semiconductor islands 151*a*, which are not covered with the gate lines 121 and the gate electrodes 124*b* as well as the second photoresist PR2, to form a plurality of N-type extrinsic regions 153*a* and 155*a*. At this time, the second semiconductor islands 151*b* are covered with the second photoresist PR2 and protected from impurity implantation.

Figure 15:
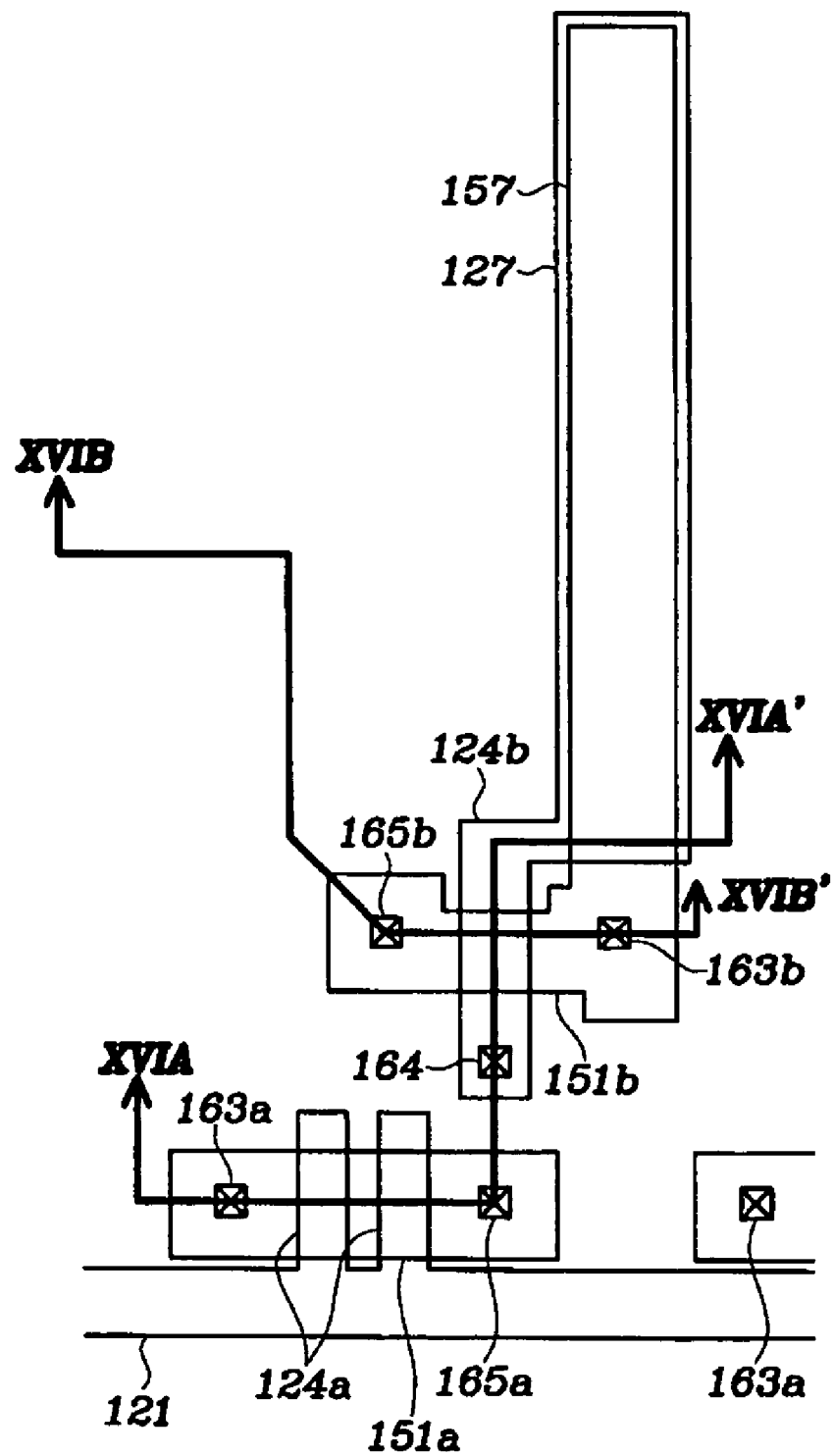
Figure 16A:
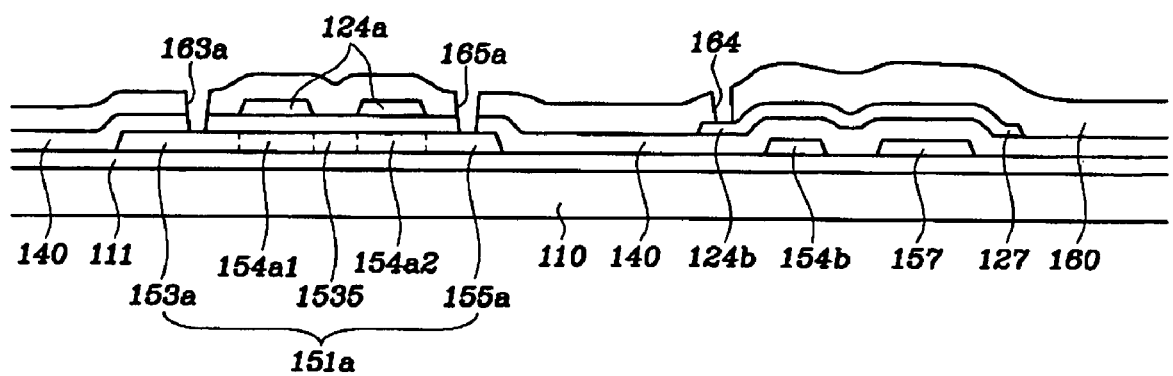
FIG. 16A and FIG. 16B are sectional views of the display panel taken along lines XVIA-XVIA' and XVIB-XVIB' of FIG. 15, respectively.
Figure 16B:
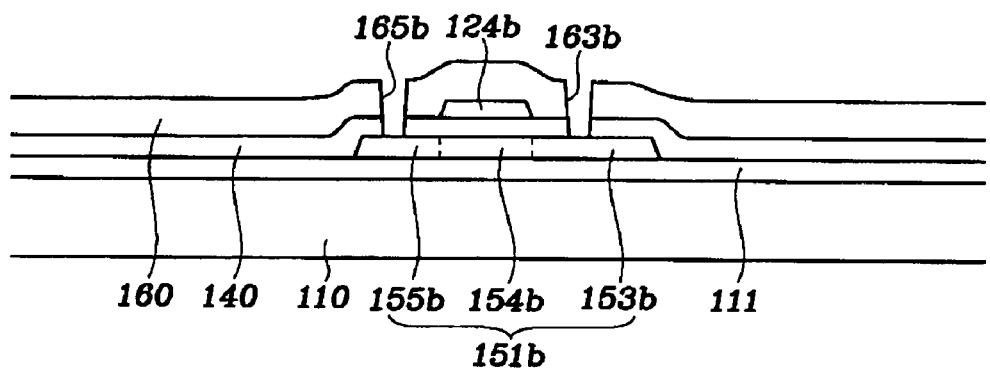
Figure 16C:
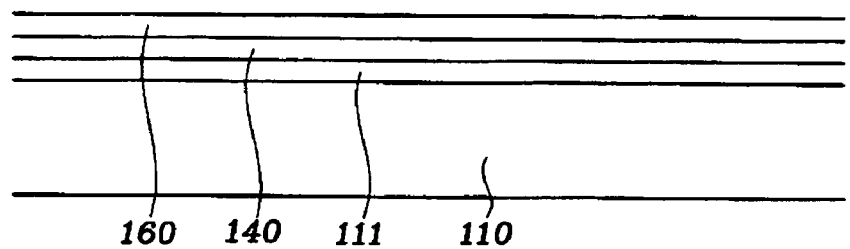
FIG. 16C is a sectional view of the display panel taken along line IV-IV' of FIG. 3 at this step.

Referring to FIGS. 15-16C, an interlayer insulating film 160 is deposited and the interlayer insulating film 160 and the gate insulating layer 140 are photo-etched to form a plurality of contact holes 163*a*, 163*b*, 165*a* and 165*b* exposing the extrinsic regions 153*a*, 153*b*, 155*a* and 155*b*, respectively, as well as a plurality of contact holes 164 exposing the gate electrodes 124*b*.

Figure 17:
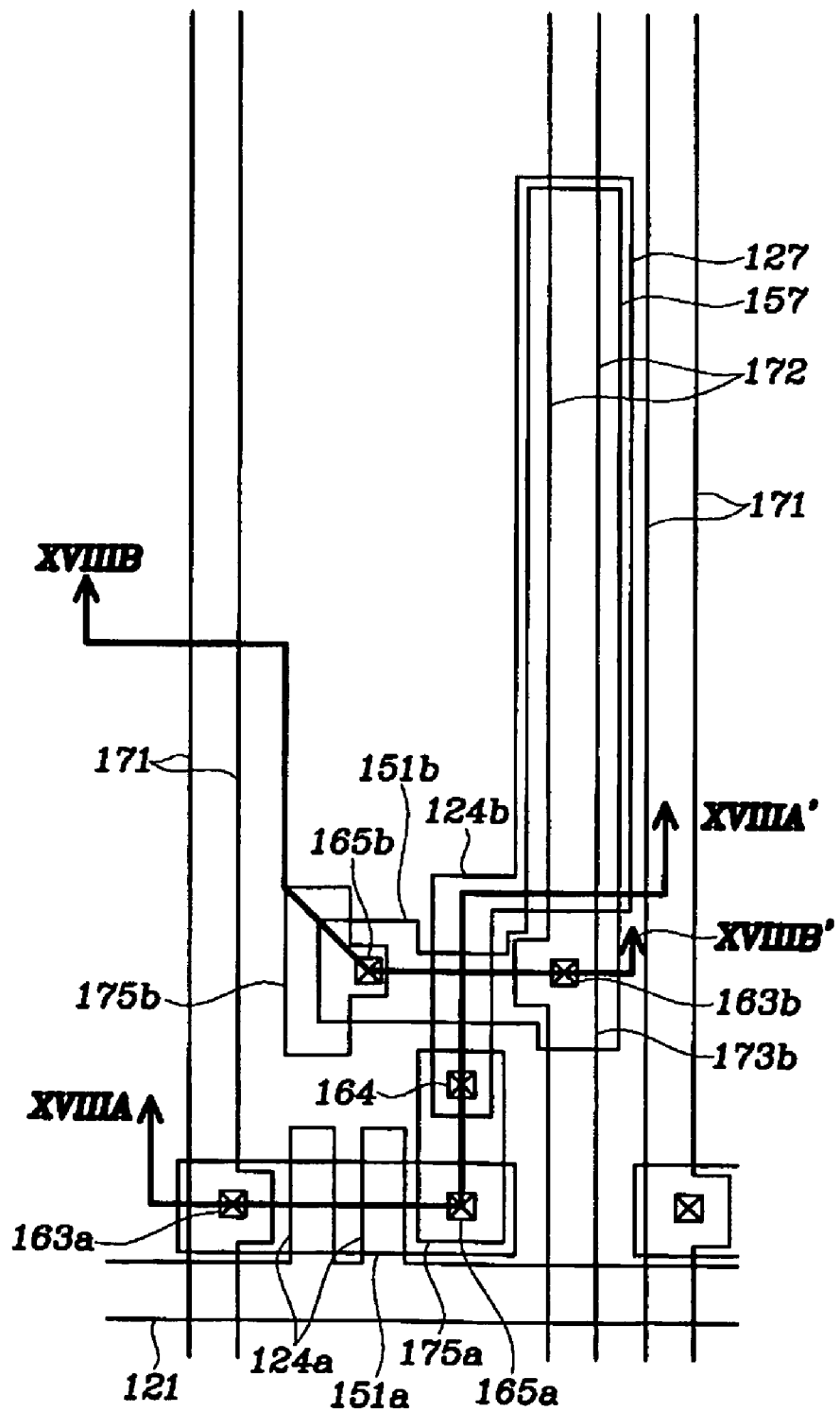
Figure 18A:
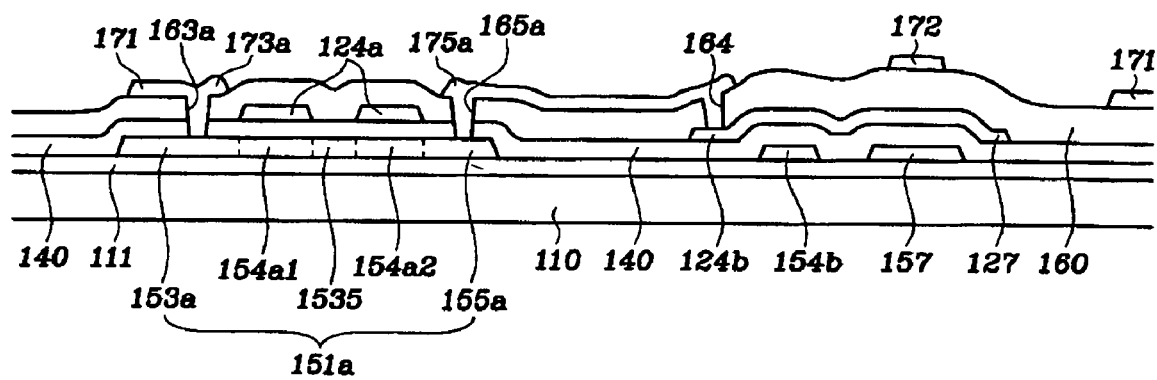
FIG. 18A and FIG. 18B are sectional views of the display panel taken along lines XVIIIA-XVIIIA' and XVIIIB-XVIIIB' of FIG. 17, respectively.
Figure 18B:
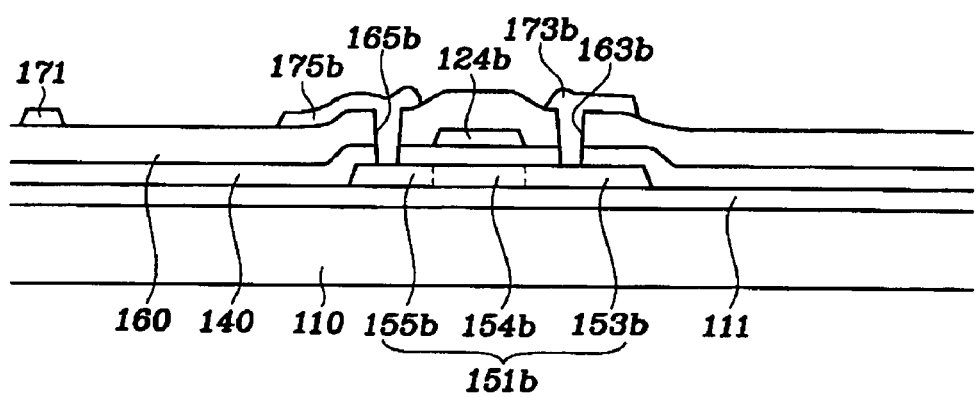
Figure 18C:
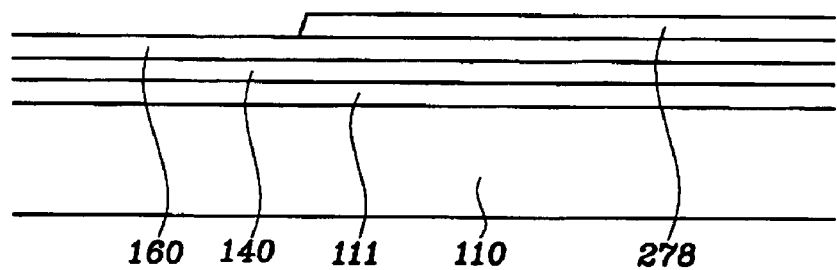
FIG. 18C is a sectional view of the display panel taken along line IV-IV' of FIG. 3 at this step.

Referring to FIGS. 17-18C, a plurality of data conductors including a plurality of data lines 171, which include first source electrodes 173*a*, a plurality of driving voltage line 172, which include second source electrodes 173b, a plurality of first and second drain electrodes 175a and 175b, and a common voltage line 278 are formed on the interlayer insulating layer 160.

Figure 19:
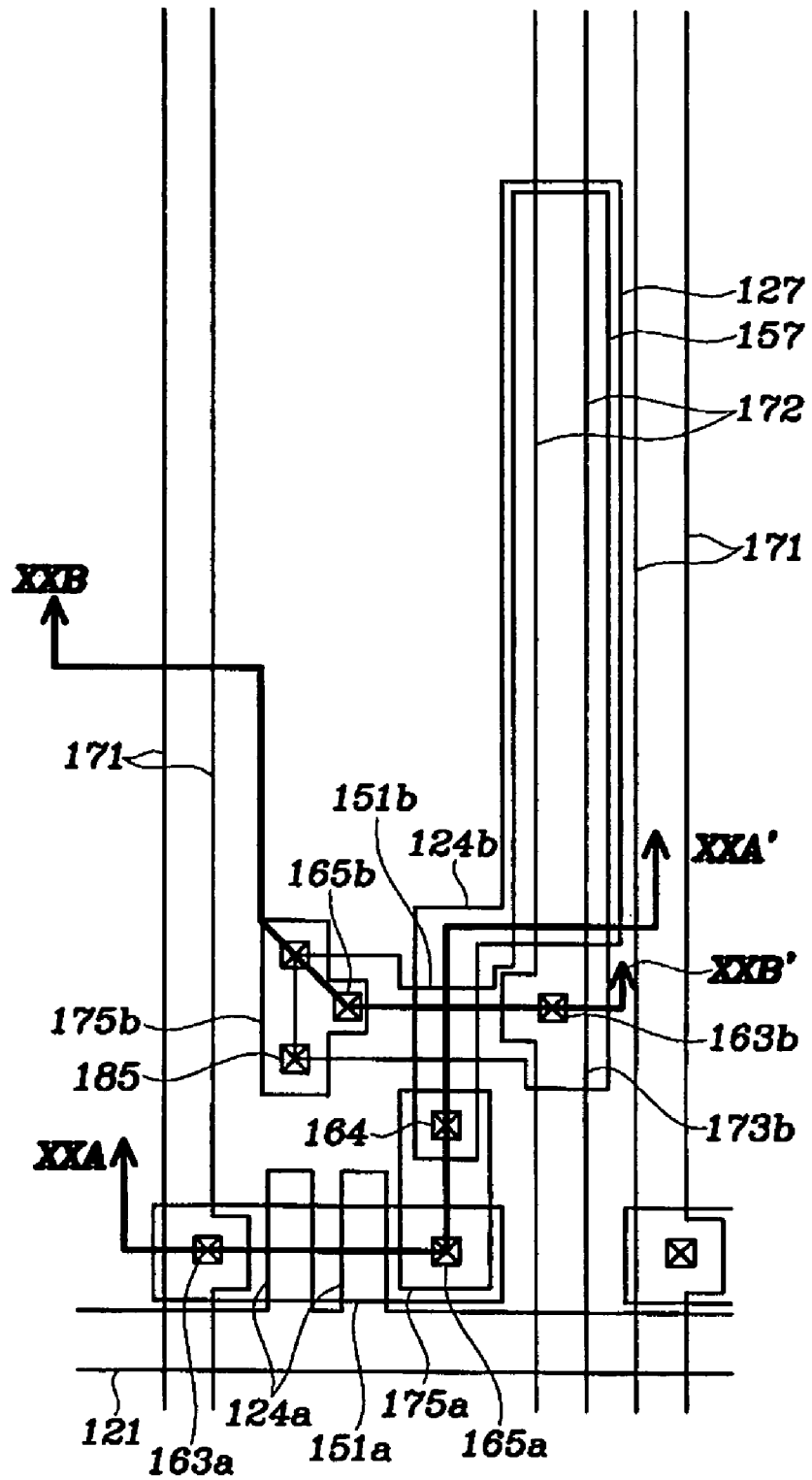
Figure 20A:
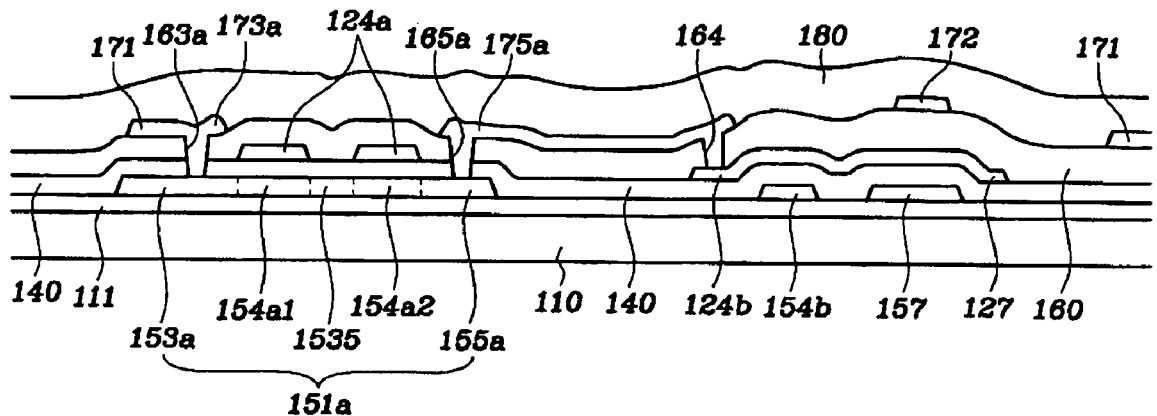
FIG. 20A and FIG. 20B are sectional views of the display panel taken along lines XXA-XXA' and XXB-XXB' of FIG. 19, respectively.
Figure 20B:
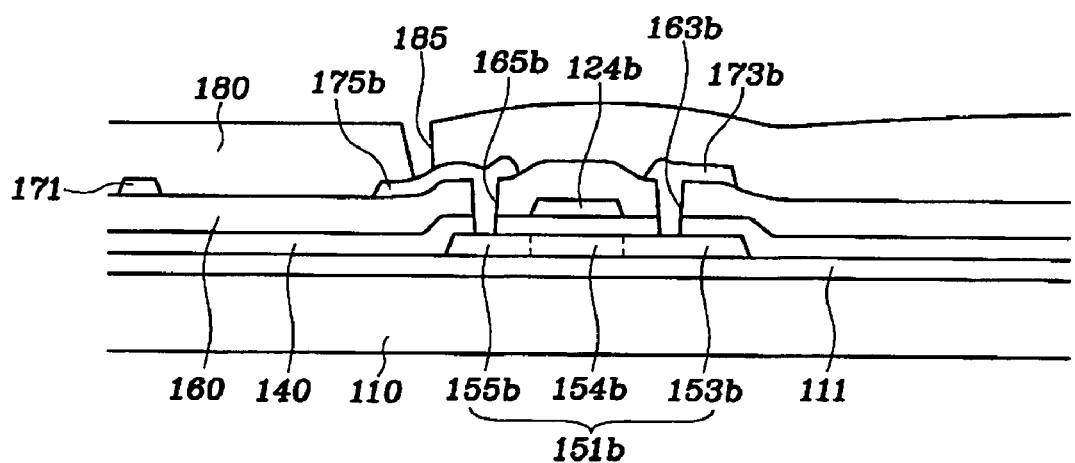
Figure 20C:
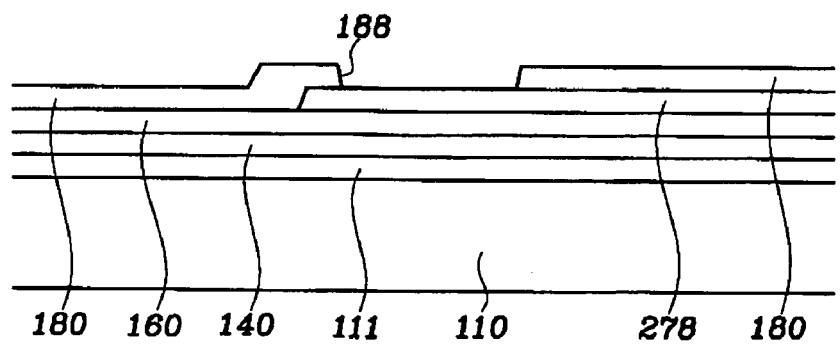
FIG. 20C is a sectional view of the display panel taken along line IV-IV' of FIG. 3 at this step.

Referring to FIGS. 19-20C, a passivation layer 180 is deposited and photo-etched to form a plurality of contact holes 185 and 188 exposing the second drain electrodes 175b and the common voltage line 278, respectively.

Figure 21:
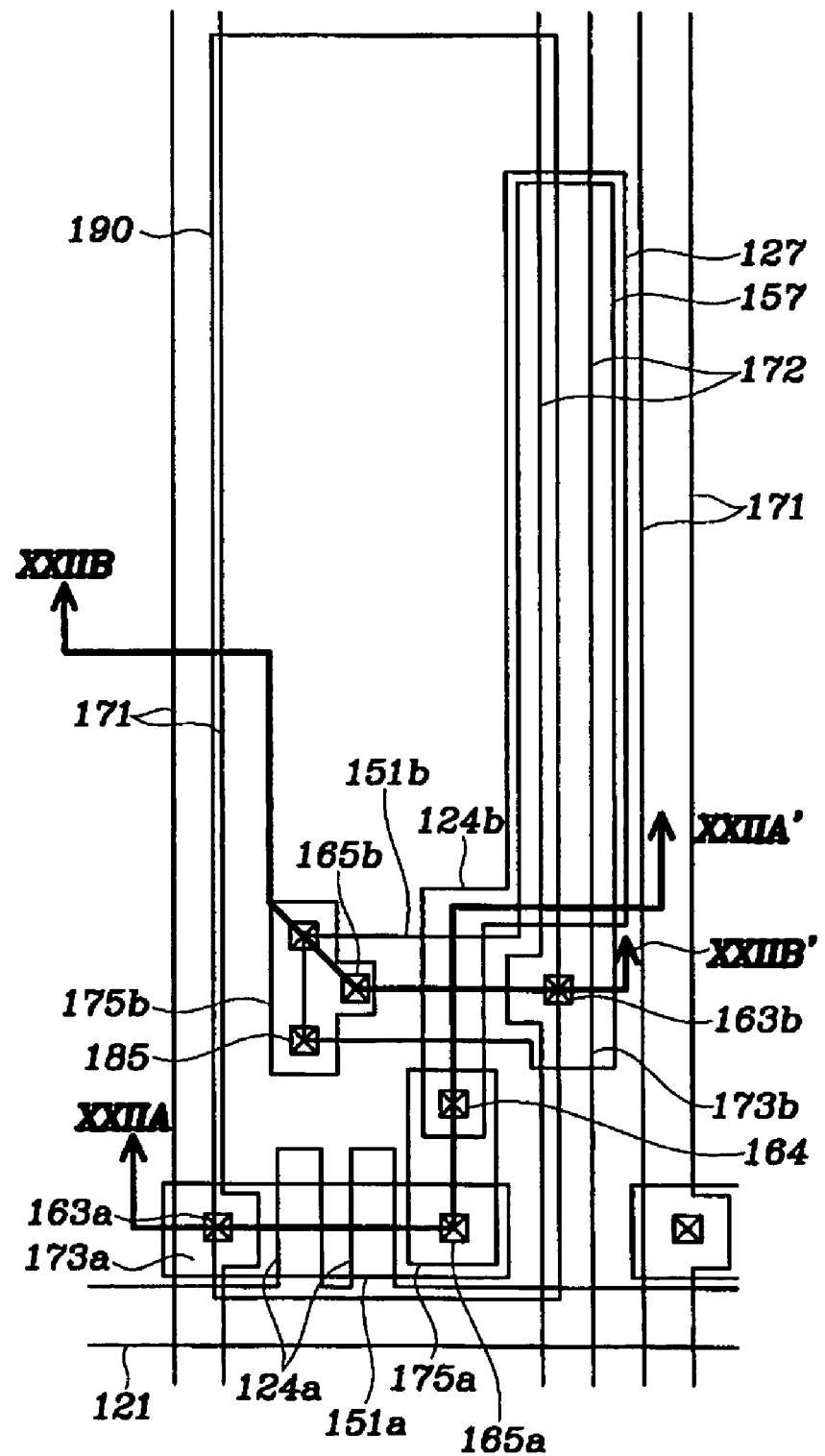
Figure 22A:
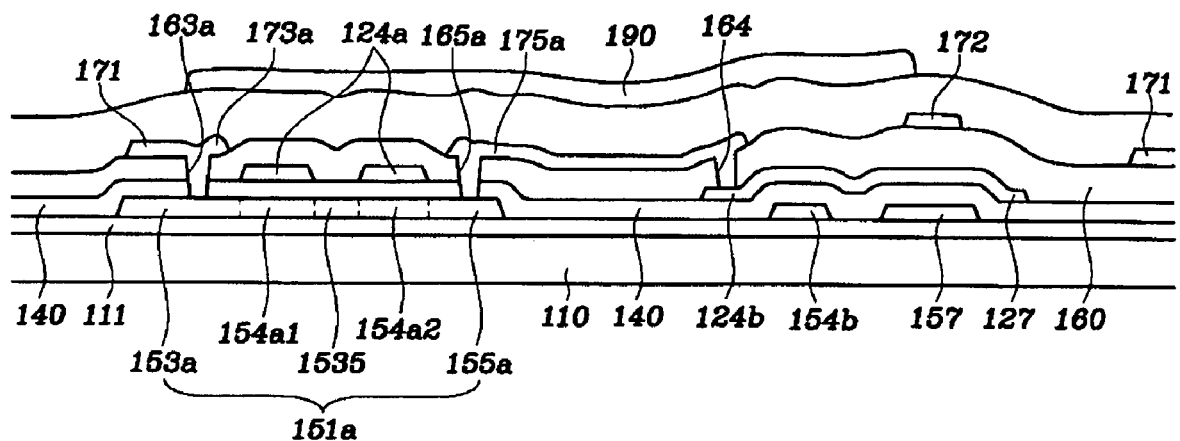
FIG. 22A and FIG. 22B are sectional views of the display panel taken along lines XXIIA-XXIIA' and XXIIB-XXIIB' of FIG. 21, respectively.
Figure 22B:
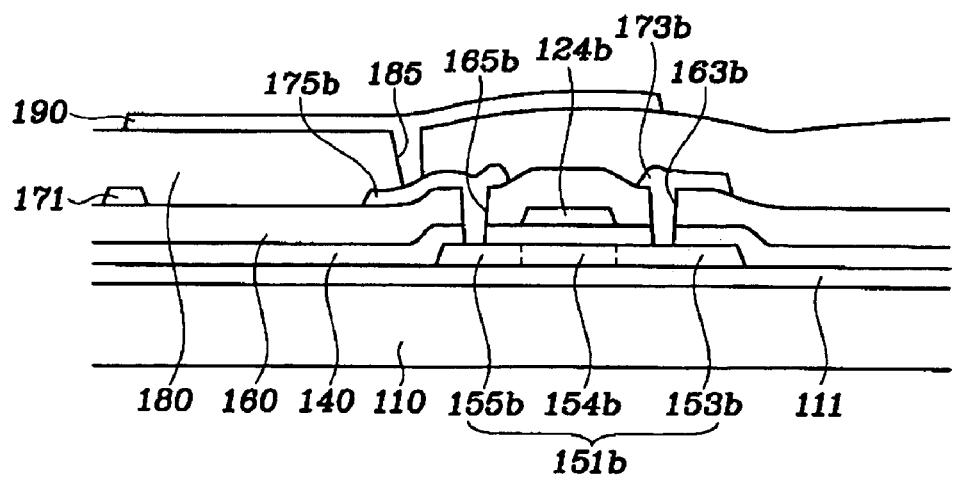
Figure 22C:
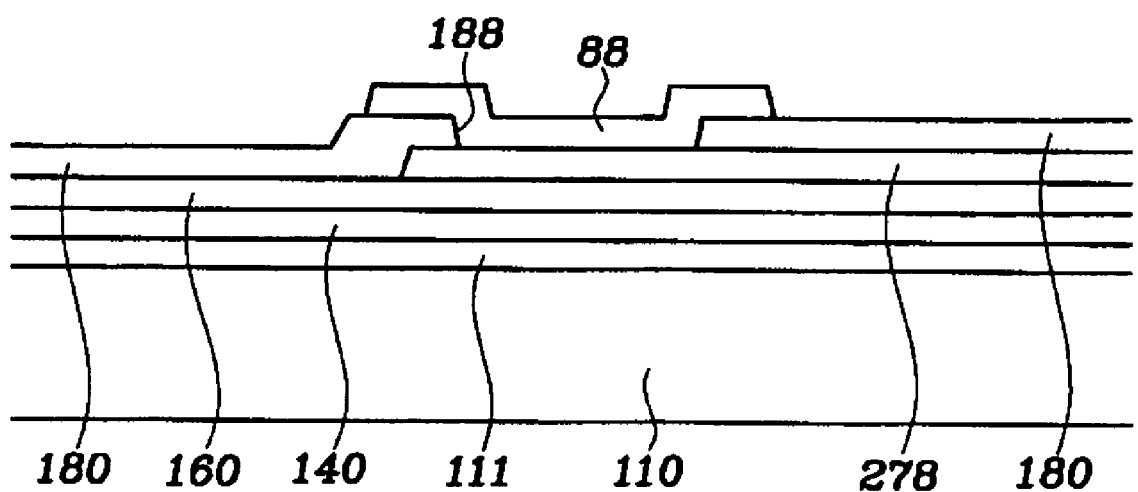
FIG. 22C is a sectional view of the display panel taken along line IV-IV' of FIG. 3 at this step.

Referring to FIGS. 21-22C, a plurality of pixel electrodes 190 and a contact assistant 88 are formed on the passivation layer 180. When the pixel electrodes 190 are made of a reflective opaque material, they may be formed of the data metal layer along with the data lines 171.

Figure 23:
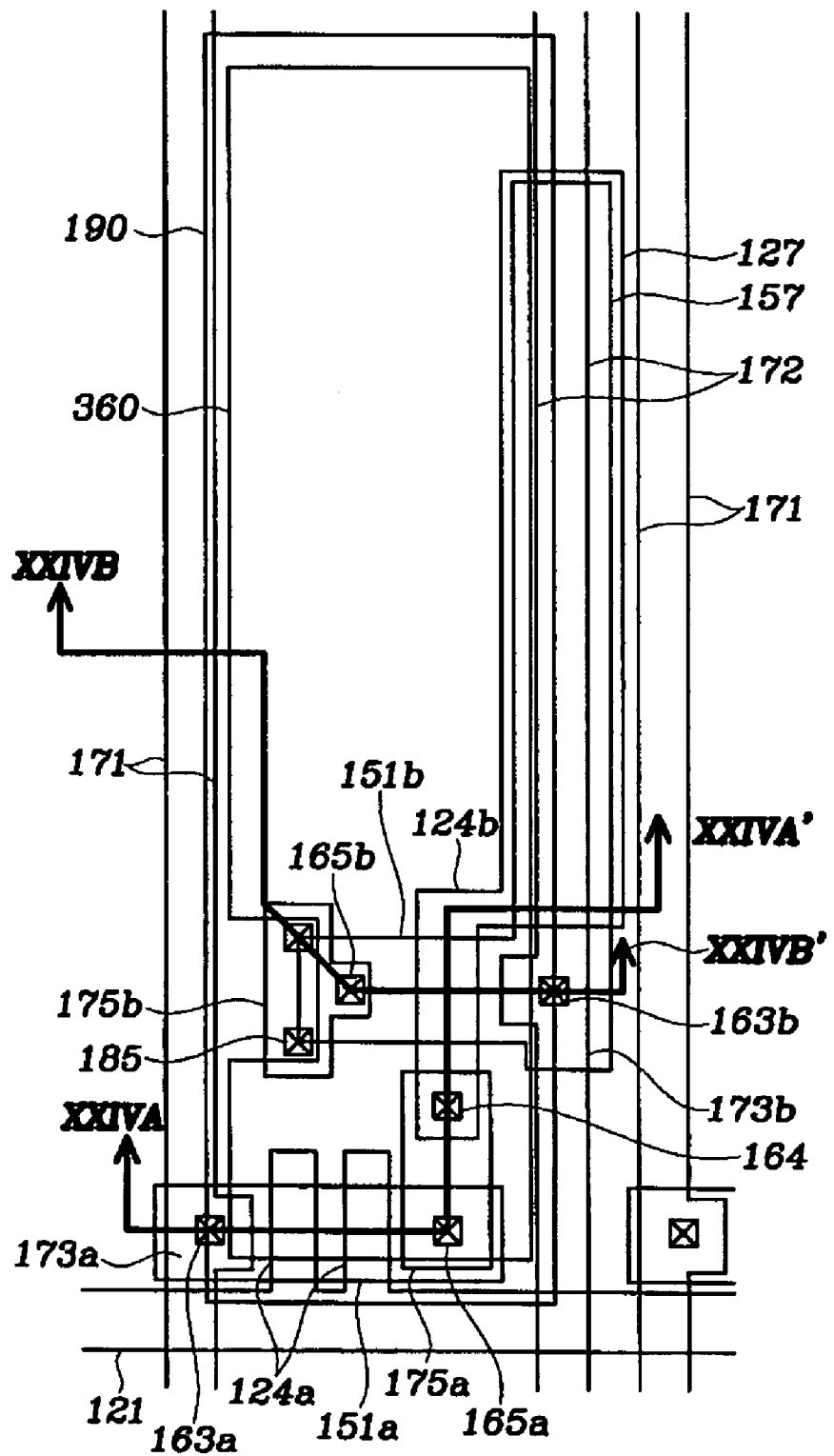
Figure 24A:
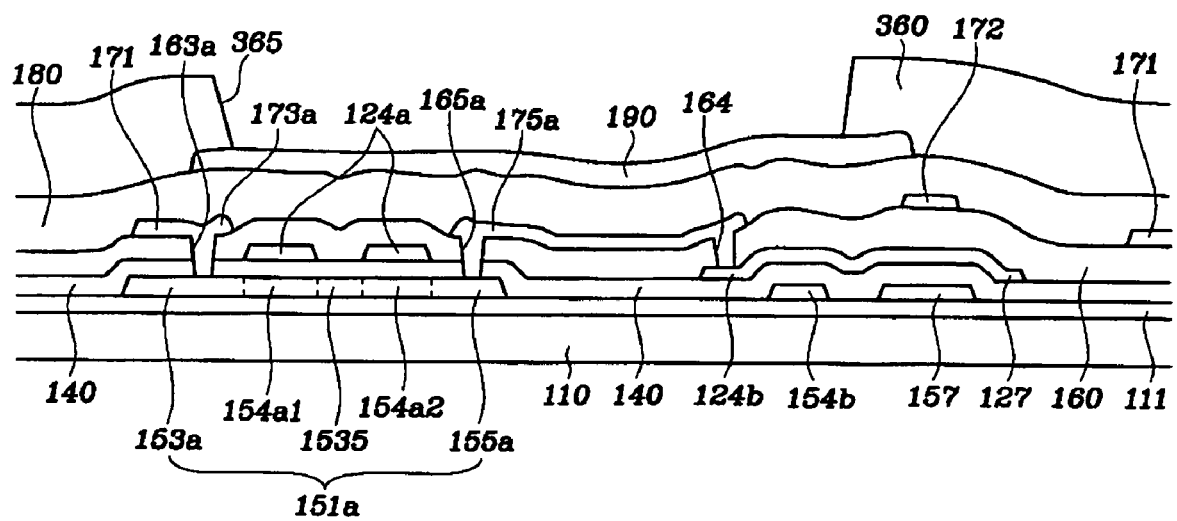
FIG. 24A and FIG. 24B are sectional views of the display panel taken along lines XXIVA-XXIVA' and XXIVB-XXIVB' of FIG. 23, respectively.
Figure 24B:
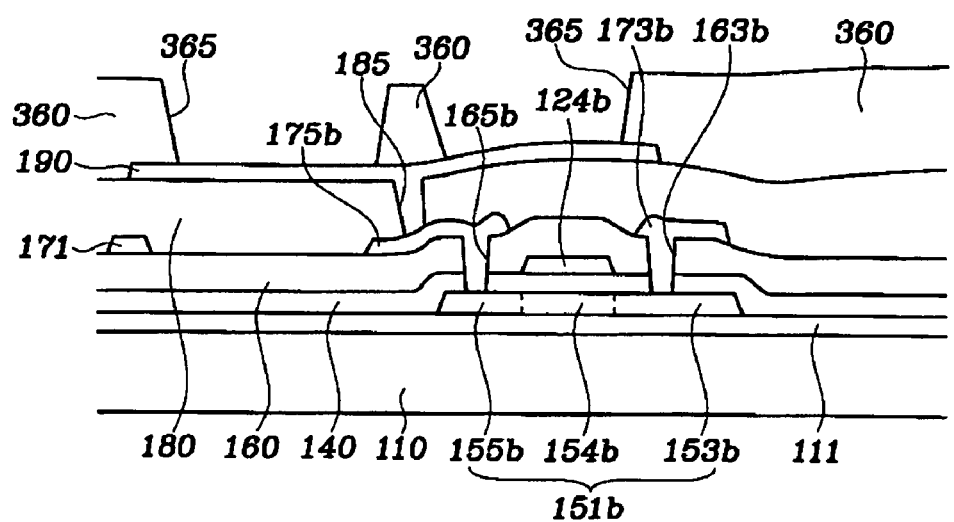
Figure 24C:
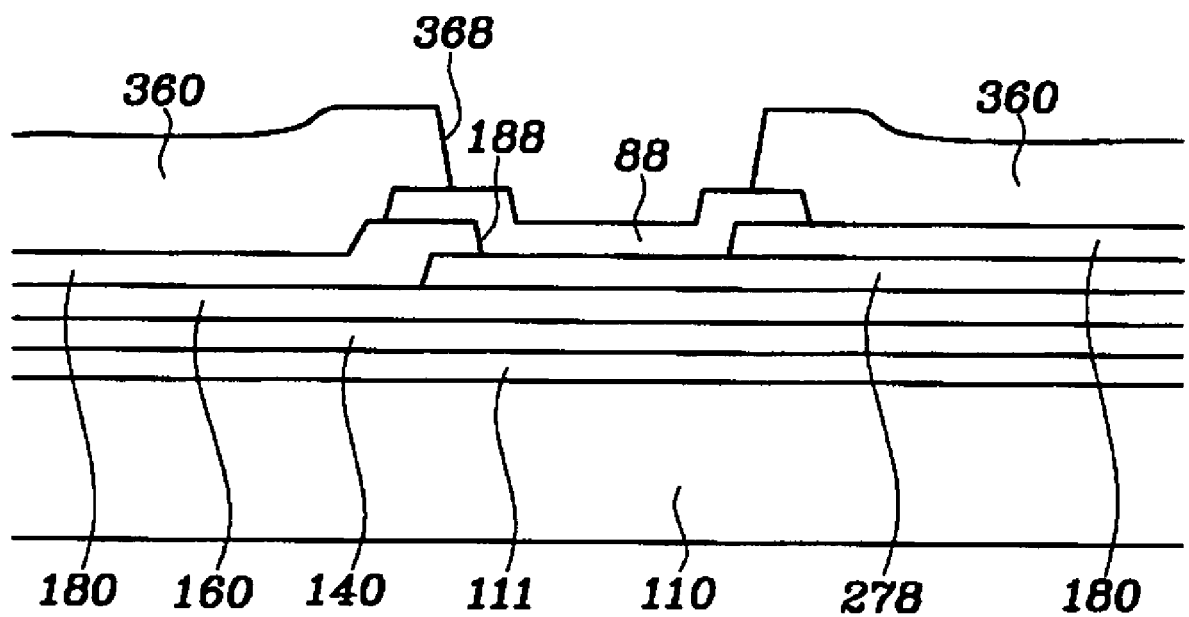
FIG. 24C is a sectional view of the display panel taken along line IV-IV' of FIG. 3 at this step.

Referring to FIGS. 23-24C, an insulating layer is deposited and patterned to form a partition 360 having a plurality of openings 365 on the pixel electrodes 190 and having at least one contact hole 368 on the contact assistant 88.

Figure 25:
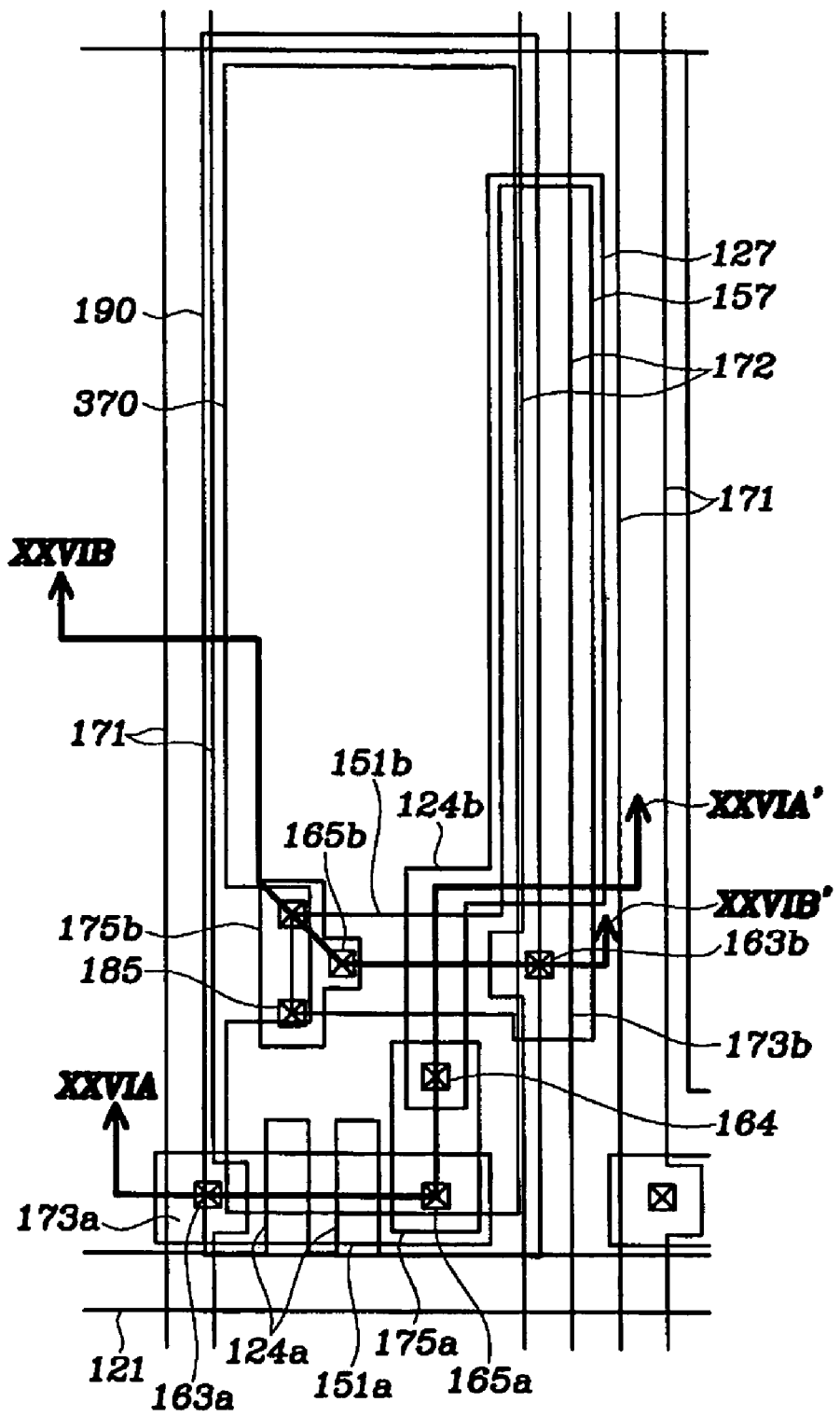
Figure 26A:
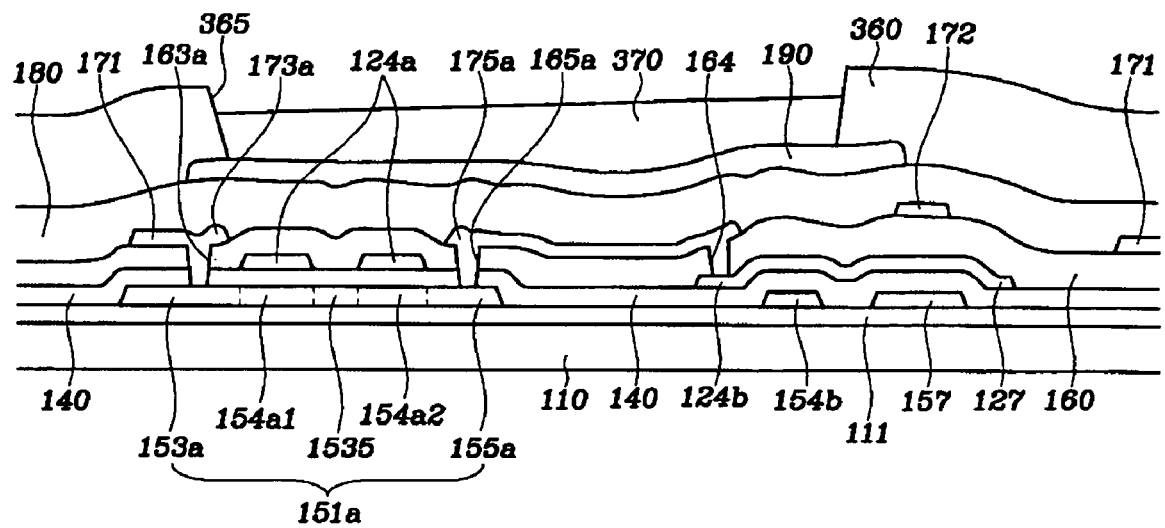
FIG. 26A and FIG. 26B are sectional views of the display panel taken along lines XXVIA-XXVIA' and XXVIB-XXVIB' of FIG. 25, respectively.
Figure 26B:
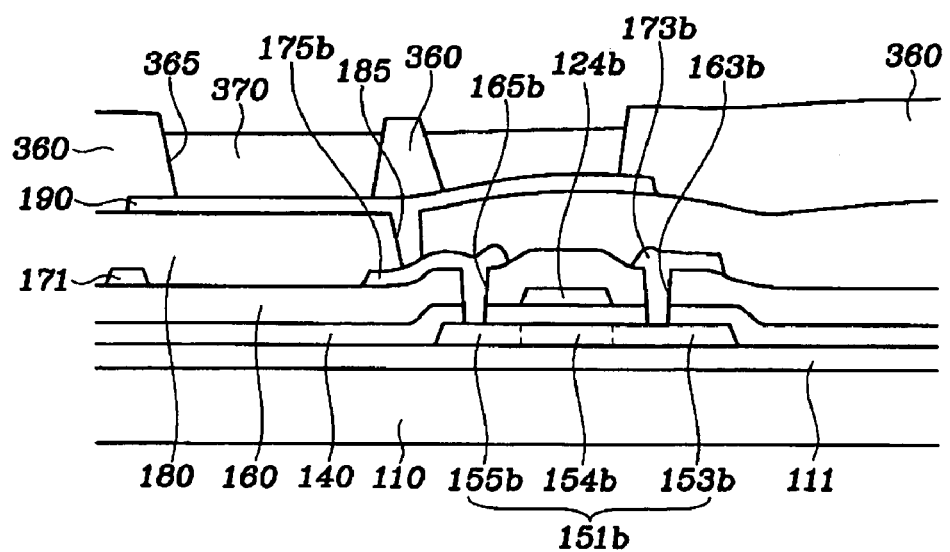
Figure 26C:
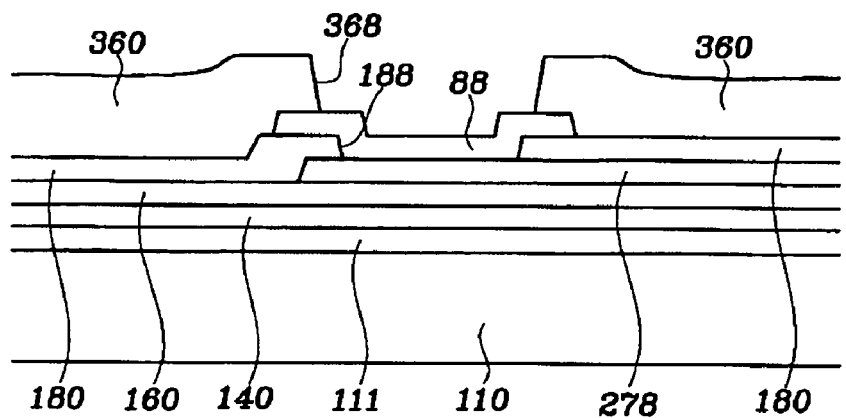
FIG. 26C is a sectional view of the display panel taken along line IV-IV' of FIG. 3 at this step.
Figure 27A:
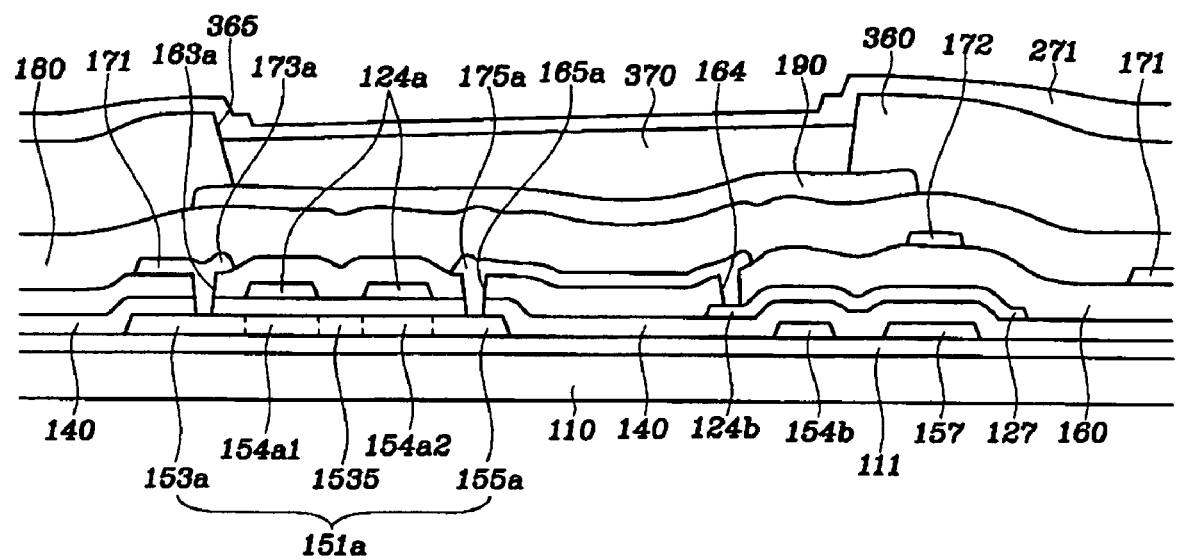
FIG. 27A and FIG. 27B are sectional views of the display panel taken along lines XXVIA-XXVIA' and XXVIB-XXVIB' of FIG. 25, respectively, and illustrate a step following the step shown in FIG. 26A and FIG. 26B.
Figure 27B:
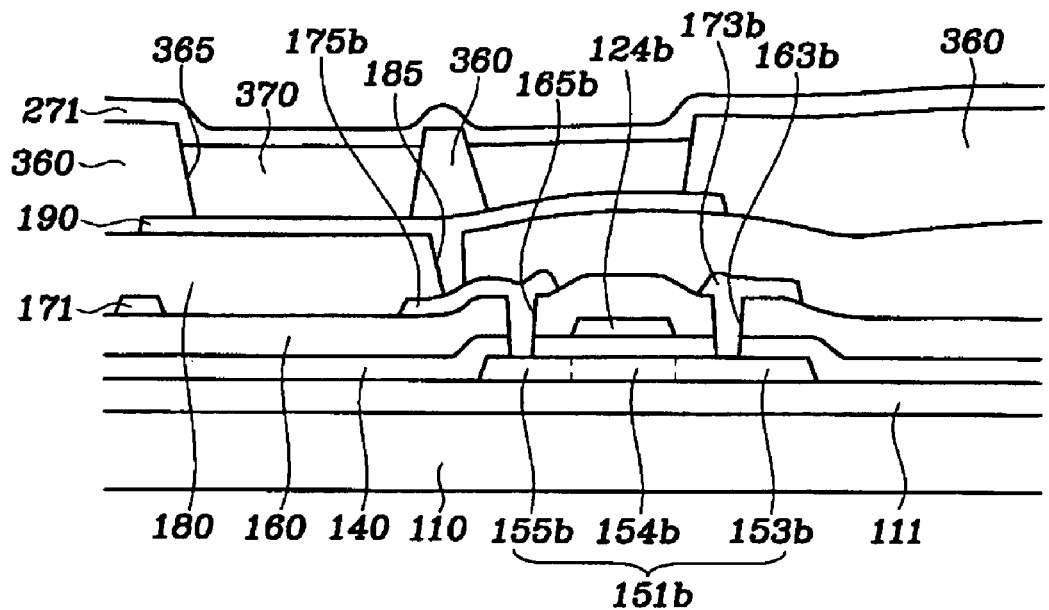
Figure 27C:
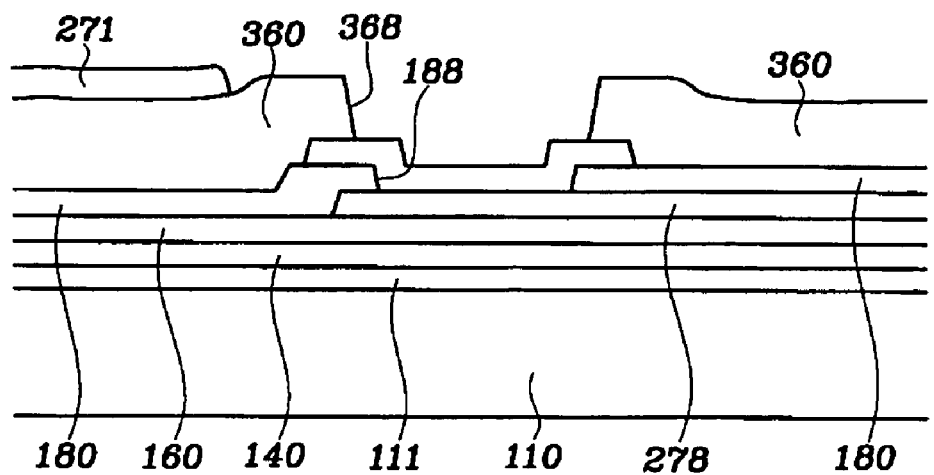
FIG. 27C is a sectional view of the display panel taken along line IV-IV' of FIG. 3 at this step.

Referring to FIGS. 25-26C, a plurality of organic light emitting members 370 including at least a light emitting layer, and which may further include multiple layers, are formed in the openings 365 by deposition or inkjet printing following a masking.

Referring to FIGS. 27A-27C, a lower electrode 271 is formed by using a shadow mask, etc., such that the lower electrode 271 is not arranged on the contact hole 368.

An upper electrode 272, having a contact portion B arranged on the contact hole 368, is formed on the lower electrode 271 as shown in FIG. 3, FIG. 4, FIG. 6 and FIG. 7. Although not shown, the OLED device may then be sealed by, for example, a sealing film or a metal cap.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display panel for an organic light emitting display, the panel comprising:
    a plurality of anode electrodes;
    a cathode electrode that is supplied with a predetermined voltage and includes a first portion facing the anode electrodes and a second portion receiving the predetermined voltage and having a different cross-section than the first portion;
    a plurality of light emitting members arranged between the anode electrodes and the cathode electrode; and
    a conductive line transmitting the predetermined voltage and contacting the second portion of the cathode electrode.

2. The display panel of claim 1, wherein the first portion comprises a multiple-layered portion.

3. The display panel of claim 2, wherein the multiple-layered portion comprises a first layer contacting the light emitting members and a second layer, the first layer being arranged between the anode electrodes and the second layer.

4. The display panel of claim 3, wherein the first layer is spaced apart from the conductive line.

5. The display panel of claim 4, wherein the second portion comprises the second layer.

6. The display panel of claim 5, wherein the first layer has a lower work function than the second layer.

7. The display panel of claim 6, wherein the first layer comprises an alkali metal or an alkali earth metal.

8. The display panel of claim 7, wherein the first layer comprises Ba, Ca, or Li.

9. The display panel of claim 5, wherein the first layer comprises LiF.

10. The display panel of claim 5, wherein the second layer has a lower resistivity than the first layer.

11. The display panel of claim 5, wherein the first layer is more oxidizable than the second layer.

12. The display panel of claim 1, wherein the conductive line has a multiple-layered structure.

13. A display panel for an organic light emitting display, the panel comprising:
    a plurality of anode electrodes;
    a plurality of light emitting members arranged on the anode electrodes, respectively;
    a metal layer including a first portion arranged on the light emitting members and a second portion spaced apart from the light emitting members; and
    a conductive line coupled to the second portion of the metal layer,
    wherein the conductive line is arranged on a layer that is beneath a layer that the light emitting members are arranged on.

14. The display panel of claim 13, further comprising an insulating layer arranged on the conductive line and under the light emitting members.

15. The display panel of claim 14, wherein the insulating layer is arranged under the anode electrodes and has a contact hole exposing the conductive line at least in part.

16. The display panel of claim 15, further comprising a contact assistant arranged between the conductive line and the metal layer.

17. The display panel of claim 16, wherein the anode electrodes comprise a transparent material.

18. The display panel of claim 17, wherein the contact assistant is arranged on the same layer as the anode electrodes.

19. The display panel of claim 13, further comprising:
    a scanning line;
    a data line;
    a switching transistor coupled to the scanning line and the data line;
    a driving transistor coupled to the switching transistor and an anode electrode; and
    a capacitor coupled between terminals of the driving transistor.

20. The display panel of claim 19, wherein the conductive line comprises the same layer as one of the scanning line and the data line.

* * * * *